(12) United States Patent
Jin

(10) Patent No.: US 8,975,702 B2
(45) Date of Patent: Mar. 10, 2015

(54) SEMICONDUCTOR DEVICE AND METHOD OF MANUFACTURING THE SAME

(75) Inventor: Zhengwu Jin, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 158 days.

(21) Appl. No.: 12/638,146

(22) Filed: Dec. 15, 2009

(65) Prior Publication Data

US 2010/0148223 A1     Jun. 17, 2010

(30) Foreign Application Priority Data

Dec. 15, 2008 (JP) ................... 2008-318713

(51) Int. Cl.
| H01L 21/70 | (2006.01) |
| H01L 21/8238 | (2006.01) |
| H01L 29/04 | (2006.01) |
| H01L 29/78 | (2006.01) |

(52) U.S. Cl.
CPC *H01L 21/823807* (2013.01); *H01L 21/823878* (2013.01); *H01L 29/045* (2013.01); *H01L 29/7833* (2013.01); *H01L 29/7846* (2013.01)
USPC ......................................... 257/368

(58) Field of Classification Search
None
See application file for complete search history.

(56) References Cited

U.S. PATENT DOCUMENTS

| 7,420,840 B2 | 9/2008 | Jin |
| 2004/0256700 A1 | 12/2004 | Doris et al. |
| 2005/0285187 A1 | 12/2005 | Bryant et al. |
| 2006/0017137 A1 | 1/2006 | Iwamatsu |
| 2006/0157741 A1 | 7/2006 | Jin |
| 2007/0045623 A1* | 3/2007 | Jin ................................. 257/43 |
| 2007/0241365 A1* | 10/2007 | Iwamatsu ..................... 257/147 |
| 2008/0237725 A1* | 10/2008 | Suzuki et al. ................. 257/368 |
| 2008/0251854 A1* | 10/2008 | Shimooka et al. ............ 257/374 |

FOREIGN PATENT DOCUMENTS

| JP | 2004-063591 | 2/2004 |
| JP | 2006-040911 | 2/2006 |
| JP | 2006-286889 | 10/2006 |
| JP | 2006-527915 | 12/2006 |
| JP | 2007-067086 | 3/2007 |
| JP | 2007-142104 | 6/2007 |
| JP | 2008-504677 | 2/2008 |
| JP | 2008-218797 | 9/2008 |

(Continued)

OTHER PUBLICATIONS

First Office Action of Reasons of Rejection for Patent Application No. 2008-318713 Dated Apr. 2, 2013, 11 pgs.

(Continued)

*Primary Examiner* — Whitney T Moore
*Assistant Examiner* — Joseph Galvin, III
(74) *Attorney, Agent, or Firm* — Amin, Turocy & Watson, LLP

(57) ABSTRACT

A semiconductor device includes an insulated-gate field-effect transistor which is disposed on a semiconductor substrate having an element formation plane in a (110) plane direction, and which has a channel length direction in a <−110> direction, and a first element isolation insulation film which is buried in a trench in an element isolation region of the semiconductor substrate and has a positive expansion coefficient, the first element isolation insulation film applying a compressive stress by operation heat to the insulated-gate field-effect transistor in the channel length direction.

14 Claims, 25 Drawing Sheets

(56) References Cited

FOREIGN PATENT DOCUMENTS

| | | |
|---|---|---|
| WO | 2004-114400 | 12/2004 |
| WO | 2006-006972 | 1/2006 |

OTHER PUBLICATIONS

Office Action of Decision of Rejection for Japanese Patent Application No. 2008-318713 Dated Feb. 4, 2014, 8 pgs.

* cited by examiner

Case of plane direction (110) and channel length direction <-110> of transistor

Stress effective for pMOS and nMOS

Plane directions advantageous for pMOS and nMOS

Case of plane direction (110) and channel length direction <001> of transistor

Comparison between case of channel length direction <001> and case of channel length direction <-110> pMOS transistor (first embodiment)

pMOS (at time of driving operation)

At time of driving operation (first embodiment)

pMOS transistor (second embodiment)

nMOS (third embodiment)
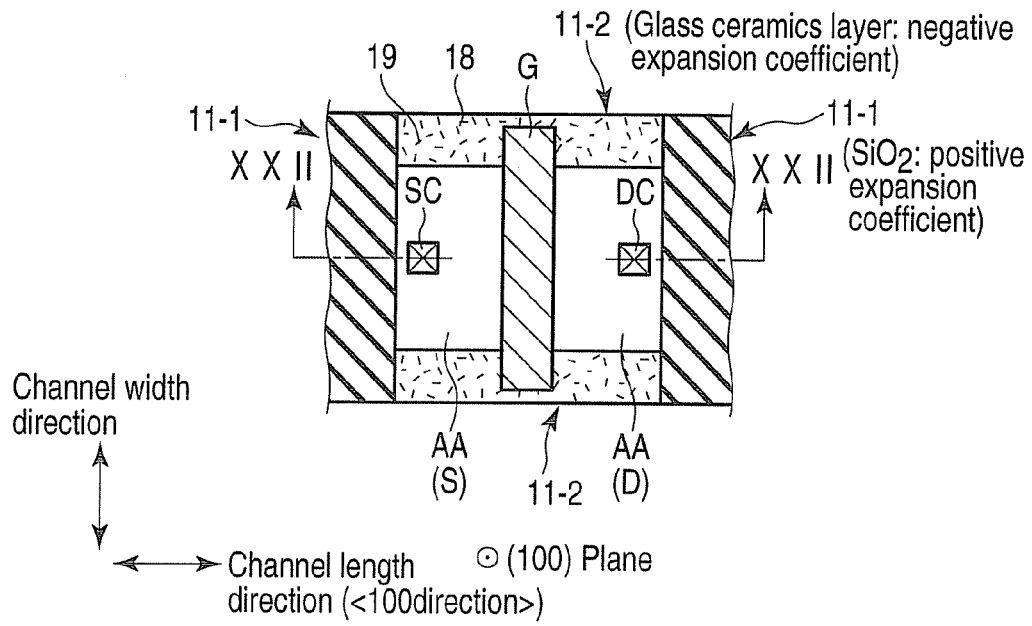
F I G. 21
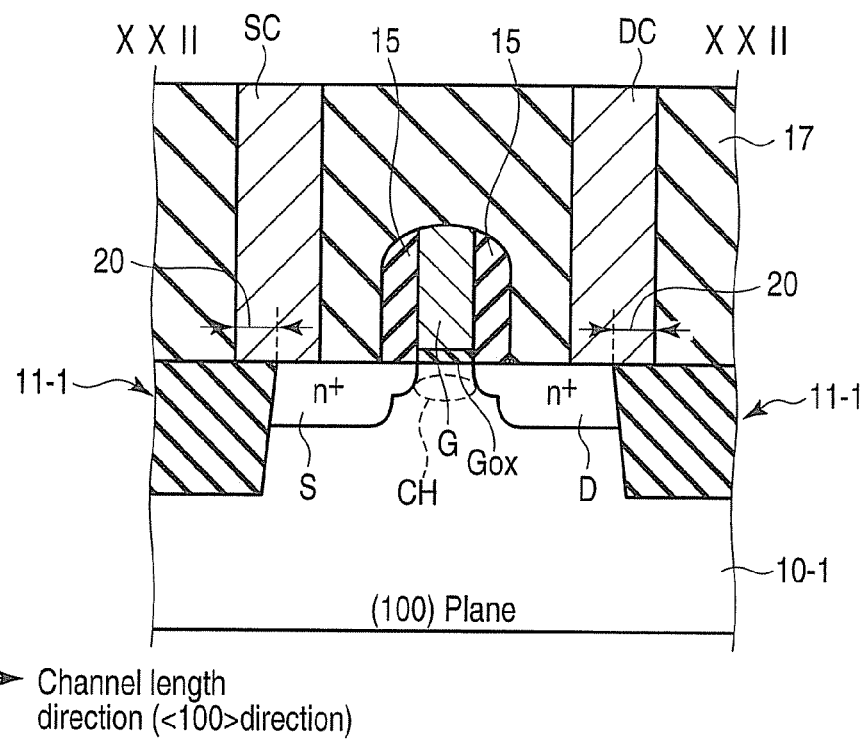
F I G. 22 nMOS (at time of driving operation: third embodiment)

At time of driving operation

Relationship between time and temperature

Manufacturing method (third embodiment)

Glass layer formation process (Δt1)

Crystal nucleus formation process (Δt2)

Crystal nucleus growth process (Δt3)

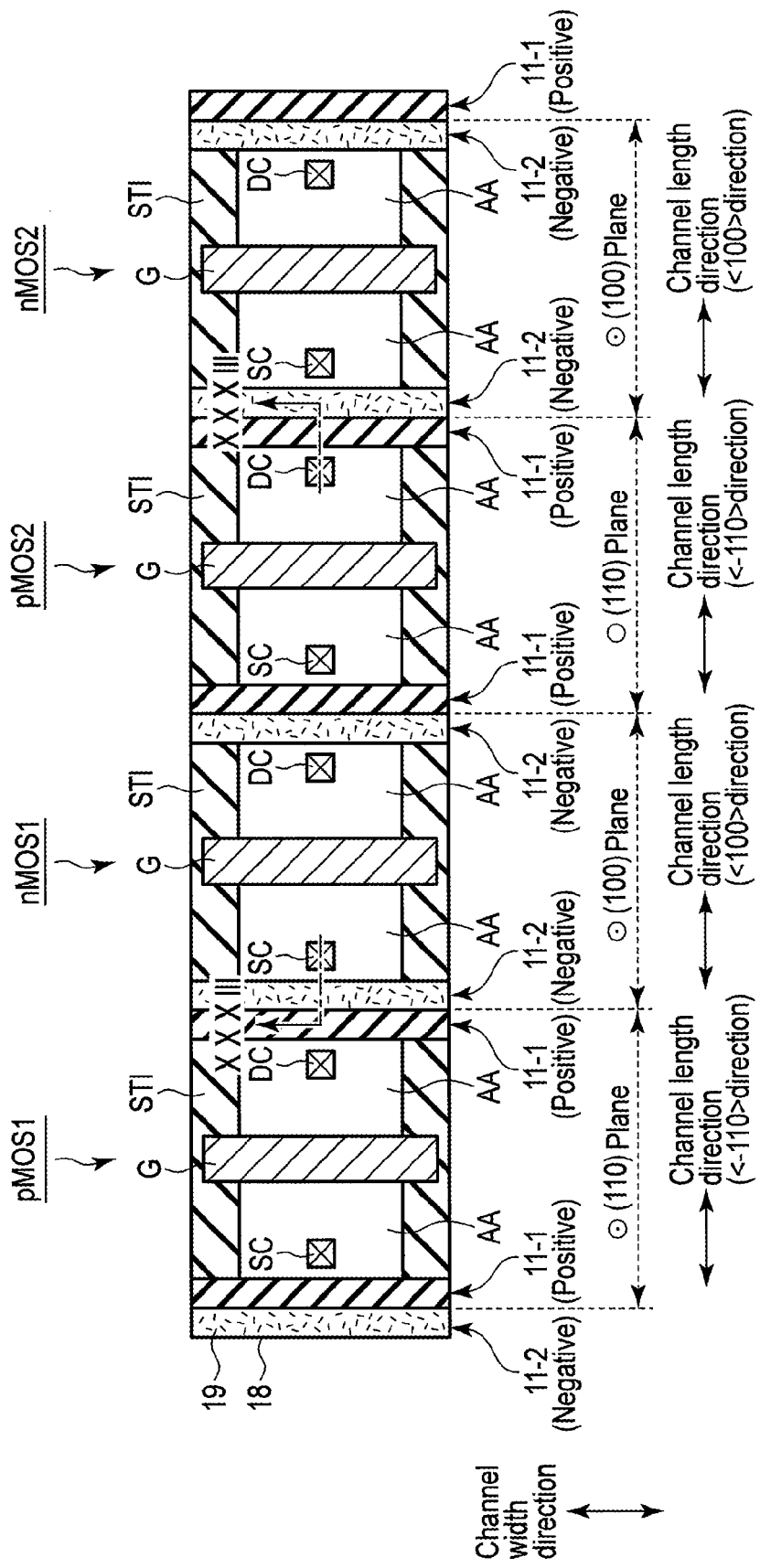
F I G. 32

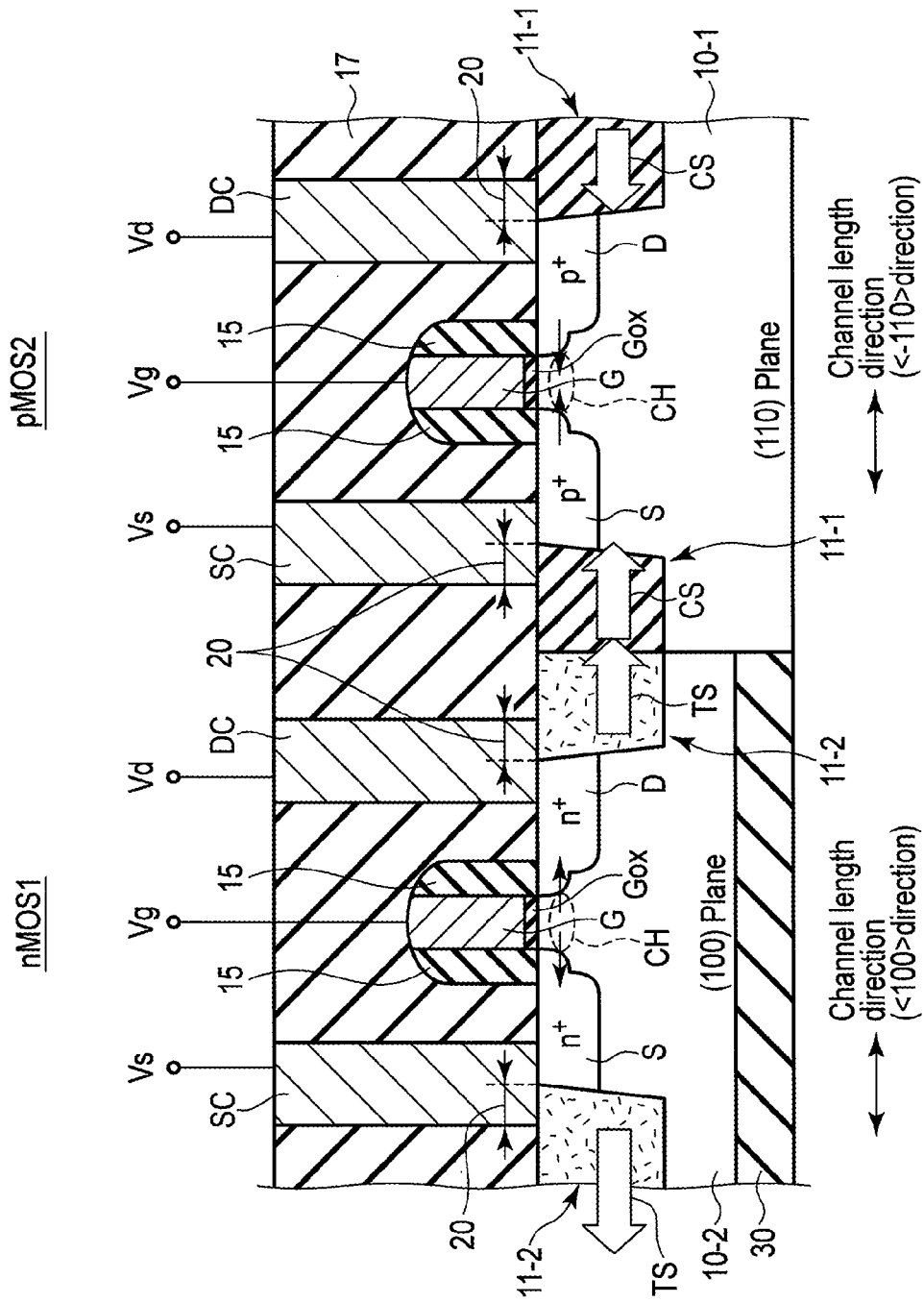
F I G. 35

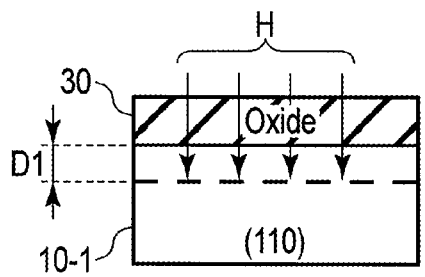
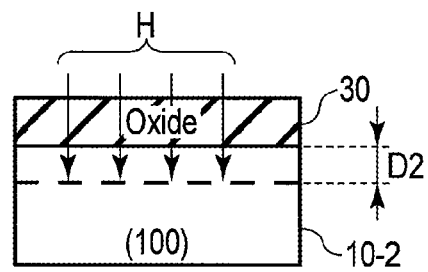
F I G. 36A        F I G. 36B
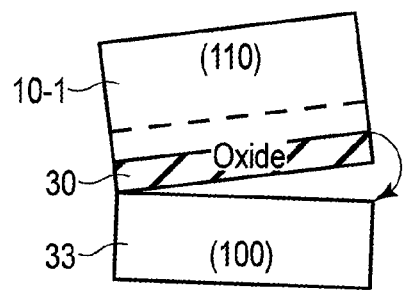
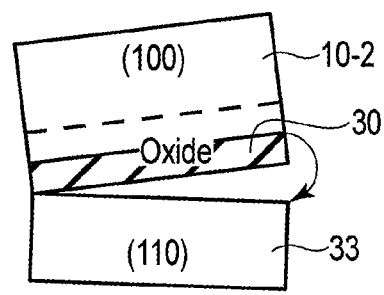
F I G. 37A        F I G. 37B
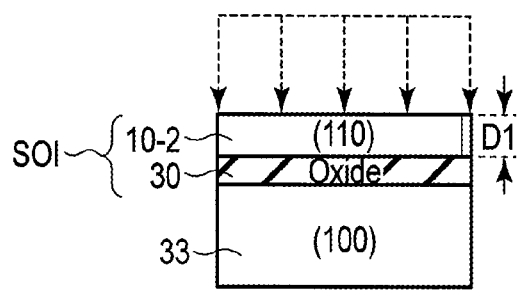
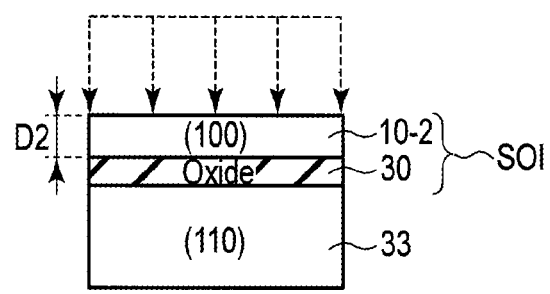
F I G. 38A        F I G. 38B

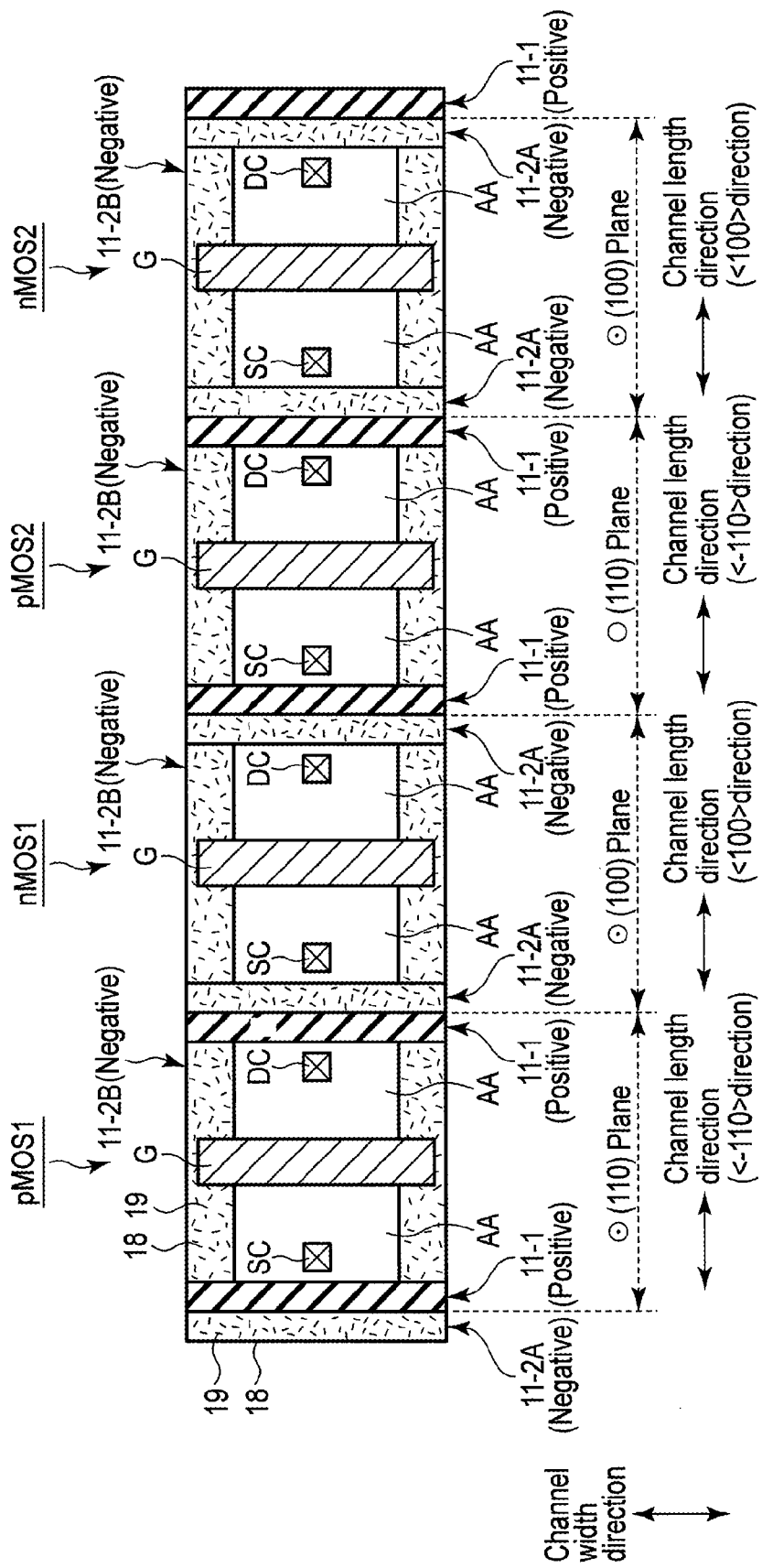
F I G. 45

SEMICONDUCTOR DEVICE AND METHOD OF MANUFACTURING THE SAME

CROSS-REFERENCE TO RELATED APPLICATIONS

This application is based upon and claims the benefit of priority from prior Japanese Patent Application No. 2008-318713, filed Dec. 15, 2008, the entire contents of which are incorporated herein by reference.

BACKGROUND OF THE INVENTION

1. Field of the Invention

The present invention relates to a semiconductor device and a method of manufacturing the same.

2. Description of the Related Art

As one of active elements constituting an LSI (large-scale integration), there is known an insulated-gate field-effect transistor (hereinafter referred to as "transistor") which is typified by a MOS (metal oxide semiconductor) transistor or a MIS (metal insulator semiconductor) transistor. With further microfabrication of such transistors, the number of transistors in an LSI becomes enormous. Thus, in proportion to the number of transistors, the amount of heat produced by the LSI becomes greater. As a result, the lattice vibration of a crystal lattice of silicon, etc., which constitutes a transistor, becomes large, and the resultant thermal disturbance becomes a factor which decreases the mobility of electrons or holes (carriers).

Under the circumstance, there has been proposed a semiconductor device wherein a desired stress is applied to a channel region of a transistor, for example, by means of an insulating material, thereby improving the mobility of electrons or holes, which are carriers (see, for instance, Jpn. Pat. Appln. KOKAI Publication No. 2004-63591).

BRIEF SUMMARY OF THE INVENTION

According to an aspect of the present invention, there is provided a semiconductor device comprising: an insulated-gate field-effect transistor which is disposed on a semiconductor substrate having an element formation plane in a (110) plane direction, and which has a channel length direction in a <-110> direction; and a first element isolation insulation film which is buried in a trench in an element isolation region of the semiconductor substrate and has a positive expansion coefficient, the first element isolation insulation film applying a compressive stress by operation heat to the insulated-gate field-effect transistor in the channel length direction.

According to another aspect of the present invention, there is provided a semiconductor device comprising: a p-type insulated-gate field-effect transistor which is disposed on a semiconductor substrate having an element formation plane in a (110) plane direction, and which has a channel length direction in a <-110> direction; a first element isolation insulation film which is buried in a trench in an element isolation region of the semiconductor substrate and has a positive expansion coefficient, the first element isolation insulation film applying a compressive stress by operation heat to the p-type insulated-gate field-effect transistor in the channel length direction; an n-type insulated-gate field-effect transistor which is disposed on a semiconductor substrate having an element formation plane in a (100) plane direction, and which has a channel length direction in a <100> direction; and a second element isolation insulation film which is buried in a trench in an element isolation region of the semiconductor substrate and has a negative expansion coefficient, the second element isolation insulation film applying a tensile stress by operation heat to the n-type insulated-gate field-effect transistor in the channel length direction.

According to still another aspect of the present invention, there is provided a method of manufacturing a semiconductor device, comprising: forming a trench for element isolation in an element isolation region of a semiconductor substrate along two axial directions that are a channel width direction and a channel length direction, the semiconductor substrate having an element formation plane in a (100) plane direction; burying a silicon oxide film in the trench, thereby forming a first element isolation insulation film; doping a crystal seed only in the silicon oxide film extending in the channel length direction; performing a first heat treatment process on the silicon oxide film, thereby making the silicon oxide film transition into a glass state; performing a second heat treatment process on the silicon oxide film that is in the glass state, thereby precipitating a crystal nucleus in an amorphous matrix layer in the silicon oxide film; performing a third heat treatment process on the amorphous matrix layer including the crystal nucleus, thereby growing the crystal nucleus into a crystal line and forming a second element isolation insulation film including a glass ceramics layer; forming a gate insulation film on the semiconductor substrate in an element region; forming a gate electrode on the gate insulation film such that the channel length direction is set in a <-110> direction; and forming a source and a drain spaced apart in the semiconductor substrate in a manner to sandwich the gate electrode.

BRIEF DESCRIPTION OF THE SEVERAL VIEWS OF THE DRAWING

FIG. 21 is a plan view showing a semiconductor device according to a third embodiment of the present invention;

FIG. 22 is a cross-sectional view taken along line XXII-XXII in FIG. 21;

FIG. 32 is a plan view showing a semiconductor device according to a fourth embodiment of the present invention;

FIG. 35 is a cross-sectional view for explaining the driving operation of the semiconductor device according to the fourth embodiment;

FIG. 36A and FIG. 36B are cross-sectional views illustrating a fabrication step of the semiconductor device according to the fourth embodiment;

FIG. 37A and FIG. 37B are cross-sectional views illustrating a fabrication step of the semiconductor device according to the fourth embodiment;

FIG. 38A and FIG. 38B are cross-sectional views illustrating a fabrication step of the semiconductor device according to the fourth embodiment;

FIG. 45 is a plan view showing a semiconductor device according to a fifth embodiment of the present invention.

DETAILED DESCRIPTION OF THE INVENTION

The above-mentioned patent document (Jpn. Pat. Appln. KOKAI Publication No. 2004-63591) proposes a semiconductor device in which the mobility of carriers is enhanced.

In this structure, however, the stress that can be applied is constant, relative to the temperature rise of the semiconductor substrate, etc. Consequently, if the temperature of the LSI rises from room temperature to a high temperature (e.g. about 200° C.), there is a tendency that the effect by the stress becomes deficient due to an intensified thermal disturbance of silicon, etc., and the mobility of electrons or holes decreases.

Embodiments of the invention, which are to be described below, propose semiconductor devices and manufacturing methods thereof, which can make the mobility of carriers higher as the temperature becomes higher.

[Re: Knowledge about Plane Directions and Stress]

To begin with, with reference to FIG. 1 to FIG. 11, a description is given of the outline of the knowledge about plane directions and stress, which made it possible for the inventor to invent the semiconductor device and the manufacturing method thereof according to the present invention.

<1. Plane Direction (110) of Semiconductor Substrate and the Structure of Transistor>

Figure 1A:
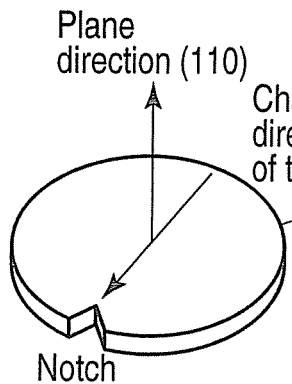
FIG. 1A is a perspective view for explaining a plane direction and a channel length direction of a semiconductor substrate according to the present invention.

1-1. Plane Direction of Semiconductor Substrate and the Channel Length Direction of Transistor As shown in FIG. 1A, the plane direction of an element formation plane of a semiconductor substrate (silicon (Si) substrate 10-1 in this example), which is described below, is a (110) plane direction.

Figure 1B:
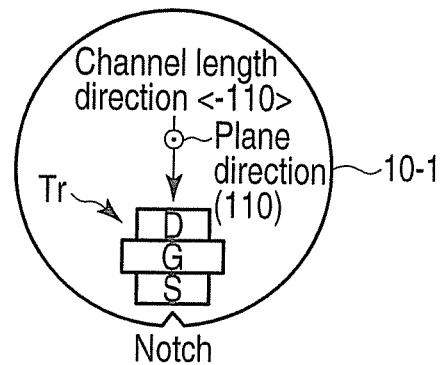
FIG. 1B is a plan view for explaining the plane direction and the channel length direction of the semiconductor substrate according to the invention.

In addition, as shown in FIG. 1B, the channel length direction of a transistor Tr, which is disposed on the (110) plane of the semiconductor substrate 10-1, is a <−110> direction along a notch. In other words, the channel length direction of a transistor Tr is the <−110> direction which is perpendicular to a direction in which a gate electrode G is disposed.

1-2. Structure Example of the Transistor According to the Study

Figure 2:
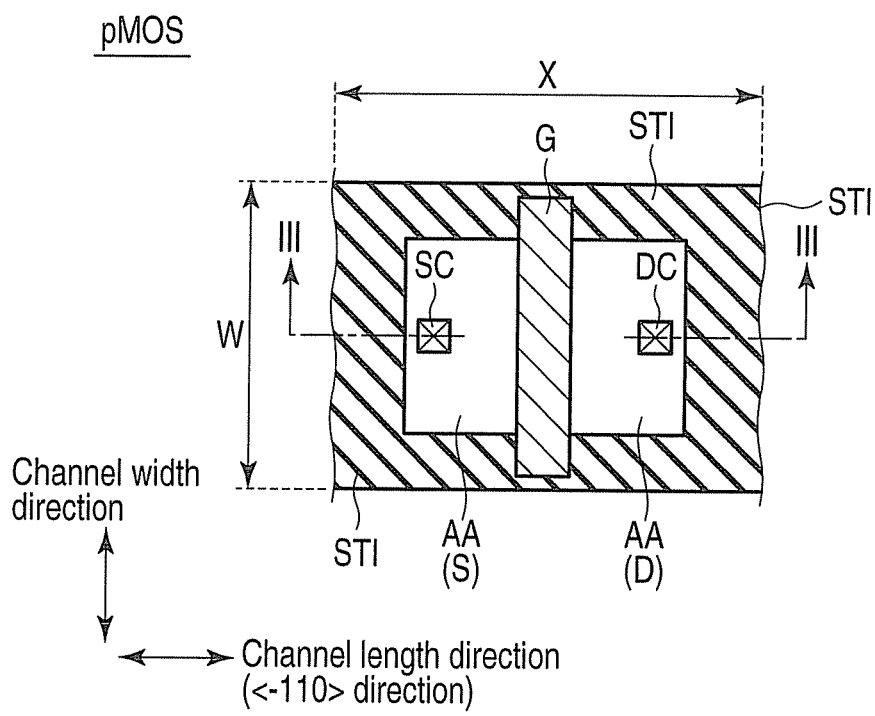
FIG. 2 is a plan view of a semiconductor device according to the invention.
Figure 3:
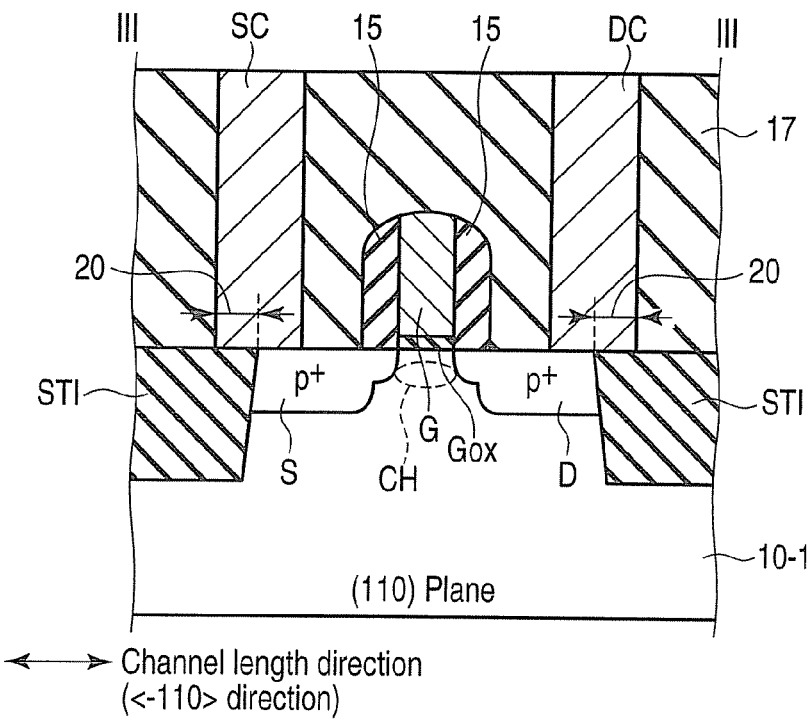
FIG. 3 is a cross-sectional view taken along line III-III in FIG. 2.

Next, referring to FIG. 2 and FIG. 3, a structure example of the transistor according to the present study is described.

As shown in FIG. 2 and FIG. 3, a semiconductor device (pMOS transistor in this example) is disposed along a channel length direction that is the <−110> direction in an element region on the surface of a semiconductor substrate (n-Sisub) 10-1 having an element formation plane that is in the (110) plane direction.

In an element isolation region of the semiconductor substrate 10-1, an element isolation insulation film STI (Shallow Trench Isolation) is buried and disposed in a manner to surround the pMOS transistor.

The pMOS transistor includes a gate insulation film Gox provided on the semiconductor substrate 10-1 whose element formation plane is the (110) plane, a gate electrode G provided on the gate insulation film Gox, a source S and a drain D provided spaced apart in the semiconductor substrate 10-1 in a manner to sandwich the gate electrode G, spacers 15 provided on side walls of the gate electrode G, and contact wiring lines SC and DC. This pMOS transistor is an insulated-gate field-effect transistor having holes, which are doped p-type impurities, as carriers.

The gate insulation film Gox is formed of, for example, a silicon oxide film ($SiO_2$) by a thermal oxidation method.

The gate electrode G is formed of, for example, polysilicon (poly-Si).

The source S and drain D ($p^+$ layer) are formed such that p-type impurities, such as boron (B), are doped, for example, by ion implantation and are thermally diffused. The doped p-type impurities release holes serving as carriers.

The spacers 15 are formed of, e.g. a silicon nitride (SiN) film.

The contact wiring lines SC and DC are provided in an interlayer insulation film 17 on the source S and drain D. Parts of the contact wiring lines SC and DC are provided on fringe portions 20 of the element isolation insulation films STI.

As shown in FIG. 2, the dimension in the channel width direction of an active area AA of the semiconductor device (insulated-gate field-effect transistor) is indicated by W, and the dimension in the channel length direction (<–110> direction) is indicated by X. The result of the study is described below.

<2. Relationship Between W or X and the Variation Amount of Drive Current>

2-1. The Relationship Between the Dimension W in the Channel Width Direction and the Variation Amount of Drive Current Next, referring to FIG. 4, a description is given of the relationship between the dimension W (μm) in the channel width direction and the variation amount (%) of drive current. The result shown in FIG. 4 relates to a TEG (Test Element Group) including pMOS transistors and nMOS transistors each having a channel length L of 0.04 μm to 1 μm. In other words, FIG. 4 shows how the drive current changes in relation to the variation of the dimension W.

Figure 4:
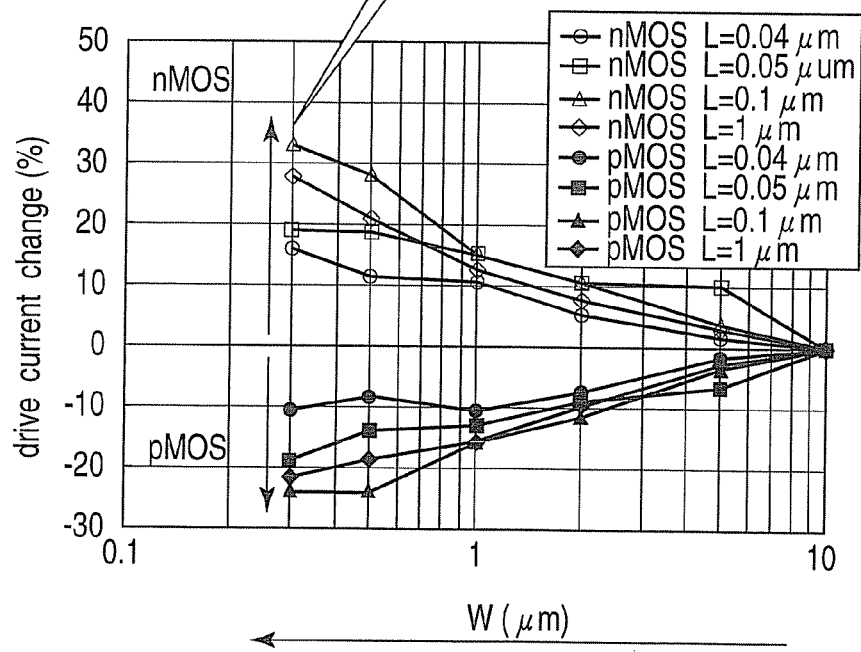
FIG. 4 is a graph showing the relationship between a channel width direction (W) and a drive current variation amount.

As shown in FIG. 4, it is understood that if the dimension W in the channel width direction varies in a range of about 10 μm to 0.2 μm, the variation amount of drive current (drive current change) of the pMOS transistor and nMOS transistor varies up to about 30%. Specifically, it is clear that as the dimension W in the channel width direction becomes smaller, the element performances of both the pMOS transistor and nMOS transistor are improved by 30%.

In FIG. 4, the sign "+/–" indicates the direction of electric current. Specifically, the direction of current in the n-type transistor is "+", and the direction of current in the p-type transistor is "–". This description also applies to FIG. 5 and FIG. 6.

2-2. The Relationship Between the Dimension X in the Channel Length Direction and the Variation Amount of Drive Current Next, referring to FIG. 5, a description is given of the relationship between the dimension X (μm) in the channel length direction and the variation amount (%) of drive current. The result shown in FIG. 5 relates to a TEG including nMOS transistors each having a channel length L of 0.04 μm to 0.06 μm, and pMOS transistors each having a channel length L of 0.04 μm to 1 μm. In other words, FIG. 5 shows how the drive current changes in relation to the variation of the dimension X.

Figure 5:
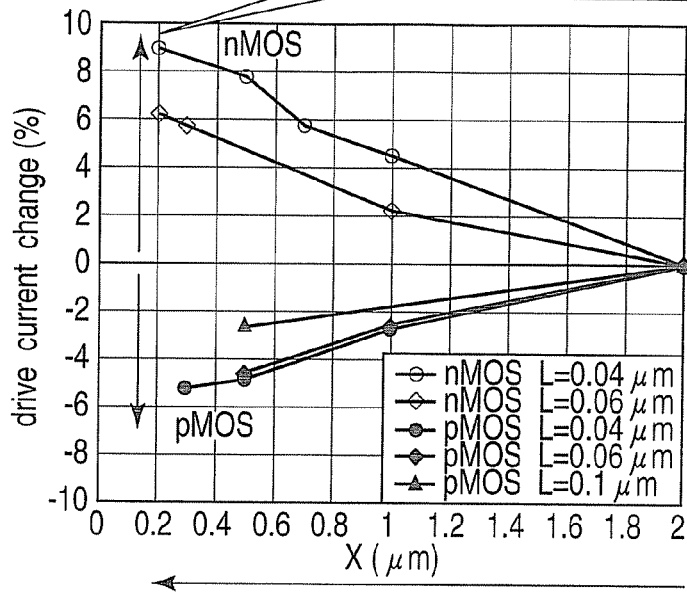
FIG. 5 is a graph showing the relationship between a channel length direction (X) and a drive current variation amount.

As shown in FIG. 5, it is understood that if the dimension X in the channel length direction varies in a range of about 2 μm to 0.2 μm, the drive currents of the pMOS transistor and nMOS transistor increase by about 6% and 10%, respectively. Specifically, it is clear that as the dimension X in the channel length direction becomes smaller, the element performances of both the pMOS transistor and nMOS transistor are improved.

2-3. The Relationship Between the Dimension X and the Variation amount of Drive Current Next, referring to FIG. 6, a description is given of the relationship between the dimension X (μm) in the channel length direction and the variation amount (%) of drive current. The result shown in FIG. 6 relates to a TEG including nMOS transistors and pMOS transistors each having a fixed channel width of 0.5 μm. In other words, FIG. 6 shows how the drive current changes in relation to the variation of the dimension X, in the same manner as described above.

Figure 6:
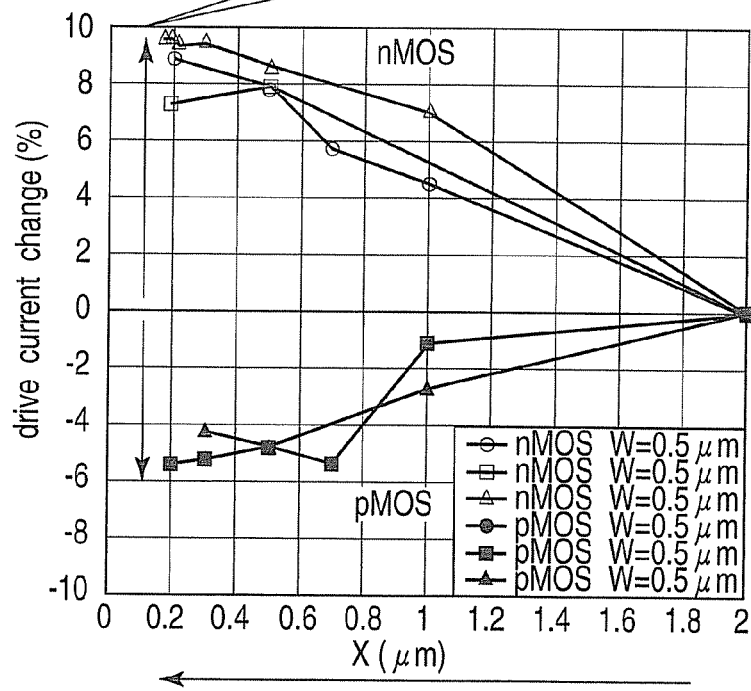
FIG. 6 is a graph showing the relationship between a channel length direction (X) and a drive current variation amount.

As shown in FIG. 6, it is understood that if the dimension X in the channel length direction varies in a range of about 2 μm to 0.2 μm, the drive currents of the pMOS transistor and nMOS transistor increase by about 6% and 10%, respectively. Specifically, it is clear that as the dimension X in the channel length direction becomes smaller, the element performances of both the pMOS transistor and nMOS transistor are improved.

<3. Relationship of the Plane Directions that are Advantageous in Association with the Conductivity Types of Transistors>

Figure 7:
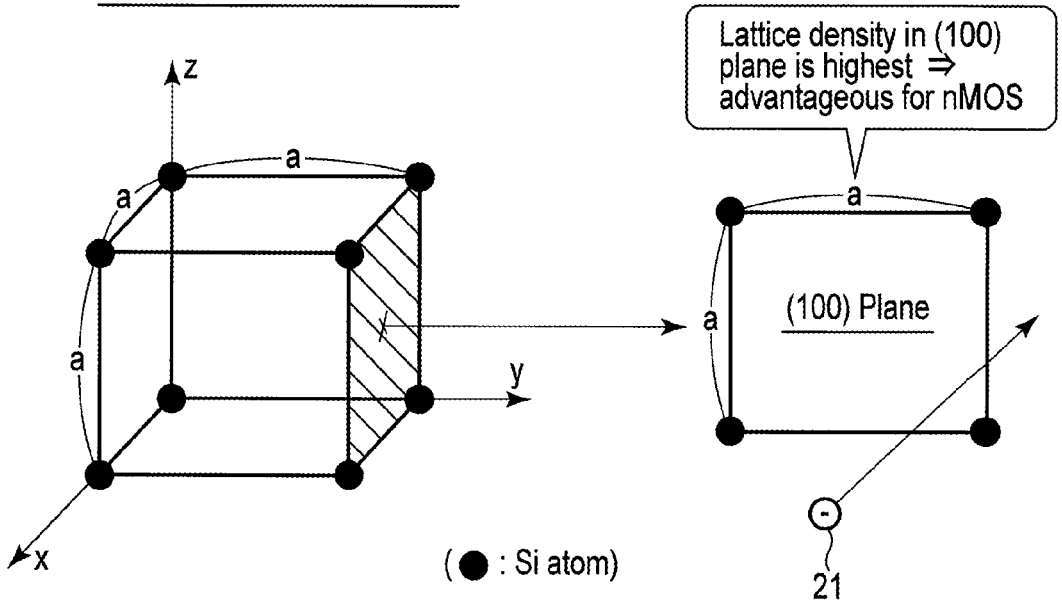
FIG. 7 is a view schematically showing a lattice density in a (100) plane direction.
Figure 8:
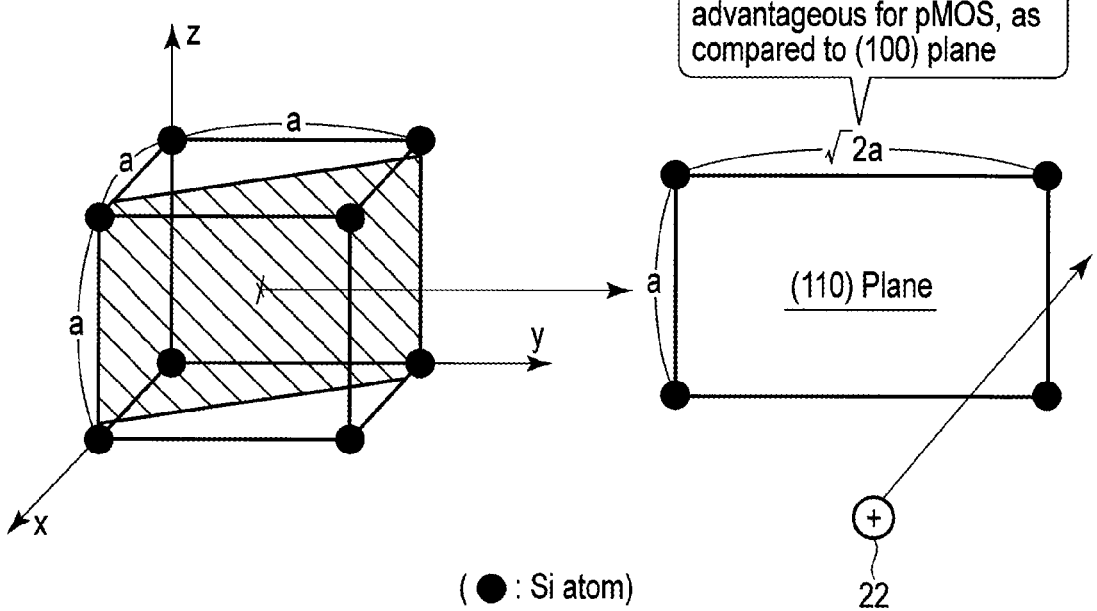
FIG. 8 is a view schematically showing a lattice density in a (110) plane direction.

Next, referring to FIG. 7 and FIG. 8, a description is given of the relationship of the plane directions that are advantageous in association with the conductivity types of transistors.

3-1. Re: nMOS Transistor

To begin with, referring to FIG. 7, the plane direction that is advantageous for the nMOS transistor is explained. FIG. 7 is a view for explaining the lattice density of the silicon (Si) substrate in the (100) plane. The distance between neighboring lattices of silicon atoms is a (Å).

As shown in FIG. 7, the (100) plane has a square shape having each side with a shortest distance a (Å) between neighboring silicon atoms. Accordingly, the lattice density is highest in the plane direction of the (100) plane. Thus, it appears that the mobility of carriers decreases when the carriers pass through the channel of silicon in the (100) plane direction.

However, in the case of the nMOS transistor, the carrier is an electron 21 having a small volume. Thus, even if the (100) plane has the highest lattice density, the mobility of electron 21 does not remarkably decrease.

In addition, in the case where a silicon oxide ($SiO_2$) film, for instance, is applied to the gate insulation film, since the lattice density is highest in the (100) plane, the bond between a silicon atom (Si) and oxygen atoms ($O_2$) can be strengthened, and the reliability of the gate insulation film can advantageously be enhanced.

Therefore, it can be said that the plane direction that is advantageous for the nMOS transistor is the (100) plane direction, from the standpoint of the mobility and the reliability of the gate insulation film.

3-2. Re: pMOS Transistor

Next, referring to FIG. 8, the plane direction that is advantageous for the pMOS transistor is explained. FIG. 8 is a view for explaining the lattice density of the silicon (Si) substrate in the (110) plane.

As shown in FIG. 8, the (110) plane has a rectangular shape having a side with a shortest distance a (Å) between neighboring silicon atoms and a side with a distance $\sqrt{2}a$ (Å). Accordingly, compared to the above-described (100) plane, the (110) plane has a lower lattice density.

In the case of the pMOS transistor, the carrier is a hole 22 having a relatively greater volume than the electron 21. Thus, the (110) plane having a relatively small lattice density is advantageous in enhancing the mobility of the hole 22.

Therefore, it can be said that the plane direction that is advantageous for the pMOS transistor is the (110) plane direction, from the standpoint of the mobility.

The description of the mobility in the sections 3-1 and 3-2 are general ones, with attention being paid to only the crystal lattices of silicon atoms. To be more precise, it is necessary to additionally consider the result of strict calculations of band structures, etc. However, with the agreement to the above-described experimental results, etc., the crystal lattice of silicon atoms can be understood as one of essential factors.

<4. Conclusion>

The conclusions of sections 4-1 to 4-3 below, which have been obtained by the inventor on the basis of the above study, are described.

4-1. Stress that is Advantageous for Both pMOS and nMOS Transistors

Figure 9:
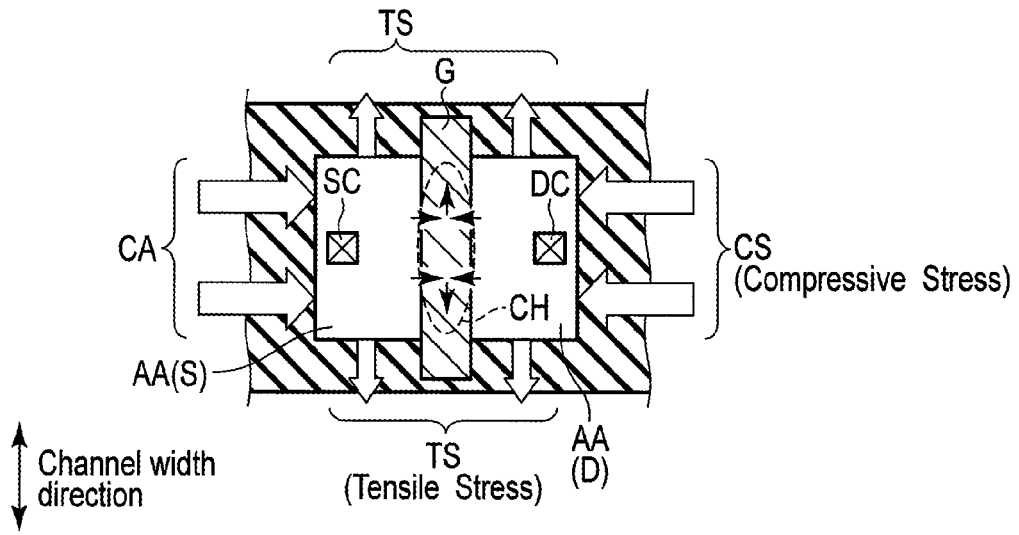
FIG. 9 is a plan view showing a stress which is advantageous for a pMOS and an nMOS.

To begin with, referring to FIG. 9, a description is given of the stress which is advantageous for both the pMOS and nMOS transistors.

The stress which is advantageous for both the pMOS and nMOS transistors is as shown in FIG. 9. A compressive stress CS is applied to a channel CH in the channel length direction, and a tensile stress TS is applied to the channel CH in the channel width direction. Alternatively, either the compressive stress CS or the tensile stress TS may be applied.

As regards the channel length direction (X dimension), as shown in FIG. 5 and FIG. 6, the device performances of both the pMOS transistor and nMOS transistor are improved as the dimension X in the channel length direction becomes smaller. The compressive stress CS is applied in the channel length direction, in consideration of the fact that "the compressive stress increases in the channel length direction as the dimension X becomes smaller".

Similarly, as regards the channel width direction (W dimension), as shown in FIG. 4, the device performances of both the pMOS transistor and nMOS transistor are improved as the dimension W in the channel width direction becomes smaller. The tensile stress TS is applied in the channel width direction, in consideration of the fact that "the tensile stress increases in the channel width direction as the dimension W becomes smaller".

4-2. Plane Directions that are Advantageous for the nMOS and pMOS Transistors

Figure 10:
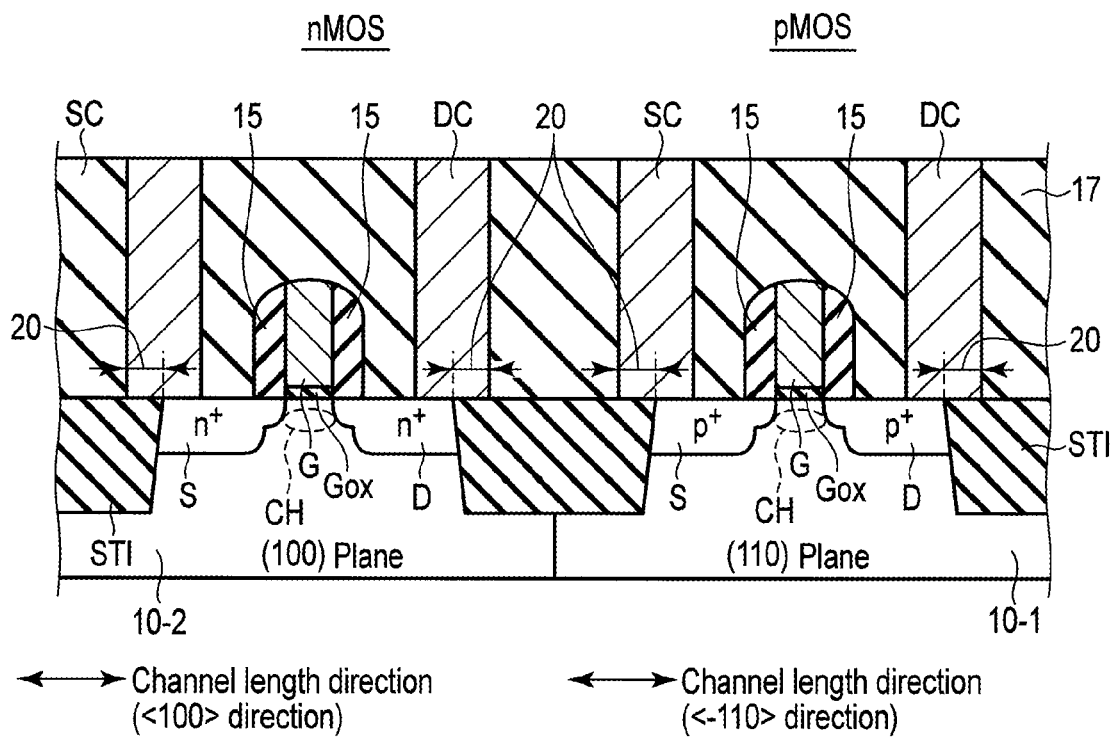
FIG. 10 is a cross-sectional view showing a plane direction which is advantageous for a pMOS and an nMOS.

Next, referring to FIG. 10, the plane directions that are advantageous for the pMOS and nMOS transistors are described. The plane directions that are advantageous for the pMOS and nMOS transistors are as shown in FIG. 10.

As shown in FIG. 10, the nMOS transistor is disposed along the channel length direction that is the <100> direction on the semiconductor substrate whose element formation plane is in the (100) plane direction. As described above in section 3-1, in the case of the nMOS transistor, the carrier is the electron 21 having a small volume. Thus, even if the lattice density is highest in the (100) plane, the mobility of the electron 21 does not decrease. In addition, in the case where the silicon oxide ($SiO_2$) film, for instance, is applied to the gate insulation film, since the lattice density is highest in the (100) plane, the bond between a silicon atom (Si) and oxygen atoms ($O_2$) can be strengthened, and the reliability of the gate insulation film can advantageously be enhanced.

Therefore, it can be said that the plane direction that is advantageous for the nMOS transistor is the (100) plane direction, from the standpoint of the mobility and the reliability of the gate insulation film.

The pMOS transistor is disposed along the channel length direction that is the <–110> direction on the semiconductor substrate whose element formation plane is in the (110) plane direction. As described above in section 3-2, since the lattice density is relatively low in the (110) plane, the mobility of the hole 22 is advantageously be improved.

Therefore, if consideration is given comprehensively from the standpoint of the mobility, it can be said that the plane direction that is advantageous for the pMOS transistor is the (110) plane direction.

4-3. Re: The Channel Length Direction that is a <001> Direction Perpendicular to the <–110> Direction Next, referring to FIG. 11 and FIG. 12, a description is given of the fact that even if the channel length direction is a <001> direction which is perpendicular to the above-described <–110> direction, the invention is applicable in the same manner as described above.

The above description has been given of the insulated-gate field effect transistor, whose channel length direction is the <–110> direction, is disposed on the semiconductor substrate having the element formation plane in the (110) plane direction. The invention, however, is not limited to the above example. The invention is similarly applicable to an insulated-gate field effect transistor whose channel length direction is set in a <001> direction which is perpendicular to the <–110> direction, with the same advantageous effect being obtained.

4-3-1. Re: The Channel Length Direction <001> of the Transistor

Figure 11A:
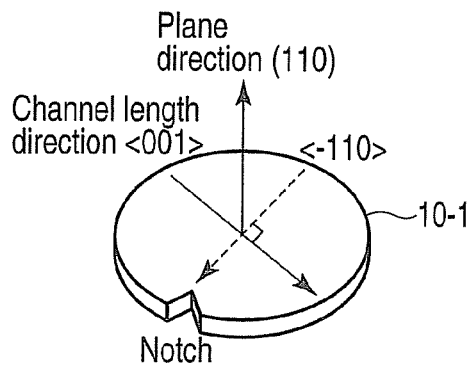
FIG. 11A and FIG. 11B are views for explaining a case in which the channel length direction is a <001> direction which is perpendicular to a <-110> direction.

As shown in FIG. 11A, the plane direction of the element formation plane of the semiconductor substrate (silicon (Si) substrate) 10-1 is the (110) plane.

Figure 11B:
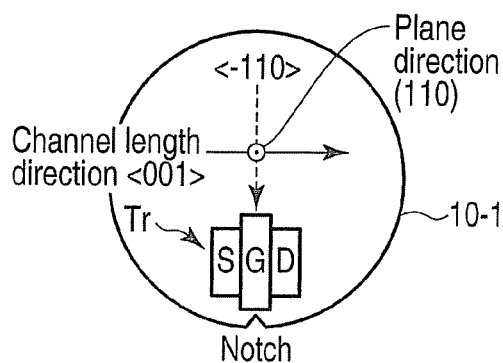

As shown in FIG. 11B, the channel length direction of a transistor Tr, which is disposed in the (110) plane of the semiconductor substrate 10-1, is the <001> direction that is perpendicular to the <–110> direction (notch direction).

4-3-2. Comparison Between the Channel Length Direction <001> and the Channel Length Direction <–110>

Figure 12:
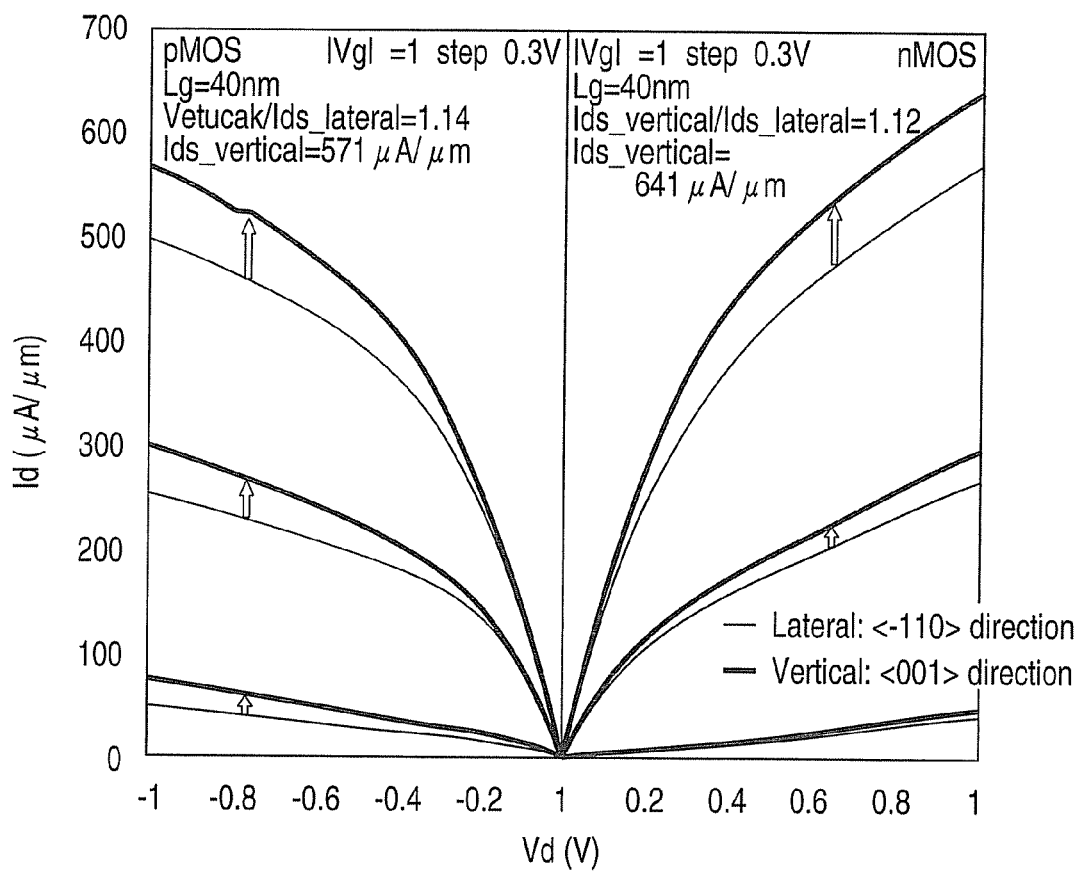
FIG. 12 is a graph for comparing the case in which the channel length direction is the <-110> direction, and the case in which the channel length direction is the <001> direction.

Next, referring to FIG. 12, a description is given of the comparison between the channel length direction <001> and the channel length direction <–110>. In FIG. 12, "Lateral" is the <–110> direction that is the above-described channel direction, and "Vertical" is the <001> direction. FIG. 12 shows the relationship between the gate voltage Vd of the pMOS and nMOS transistors, the channel length L of which is L=about 40 nm, and the drive current Id in these two directions.

As is understood from the result shown in FIG. 12, in each of the pMOS and nMOS transistors with the channel length L=about 40 nm, the transistor characteristics are better in the Vertical <001> direction than in the Lateral <–110> direction.

Thus, even in the case where the channel length direction is the <001> direction that is perpendicular to the <−110> direction, the invention is similarly applicable as in the above-described example, and the same advantageous effect can be obtained. The reason for this is that as shown in FIG. 12, the performance ratio between the case of the channel length direction <001> and the case of the channel length direction <−110> is always in a range of up to about 1.1 in both the pMOS transistor and nMOS transistor.

The description has been given above of the outline of the study of plane directions and stress, which made it possible for the inventor to invent the semiconductor device and the manufacturing method thereof according to the present invention.

The semiconductor device and the manufacturing method thereof, to which the above study is applied and which can improve the mobility of carriers as the temperature rises, are proposed below. Embodiments of the semiconductor device and the manufacturing method thereof are described concretely.

Embodiments of the invention are described with reference to the accompanying drawings. In the description below, common parts are denoted by like reference numerals throughout the drawings.

[First Embodiment (An Example in which Stress is Applied by a Device Isolation Insulation Film (Positive Expansion Coefficient)]

To begin with, referring to FIG. 13 to FIG. 16, a semiconductor device and a manufacturing method thereof according to a first embodiment of the present invention is described. This embodiment relates to an example in which stress is applied by a device isolation insulation film (positive expansion coefficient), for example, with the application of the above study in section 4-1.

<Structure Example>

Figure 13:
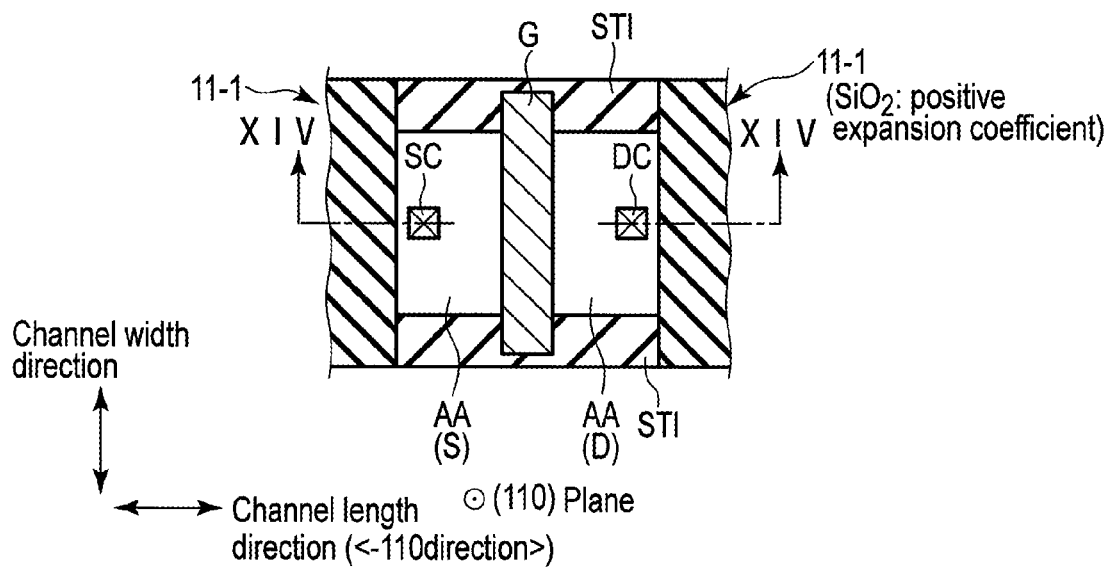
FIG. 13 is a plan view showing a semiconductor device according to a first embodiment of the present invention.
Figure 14:
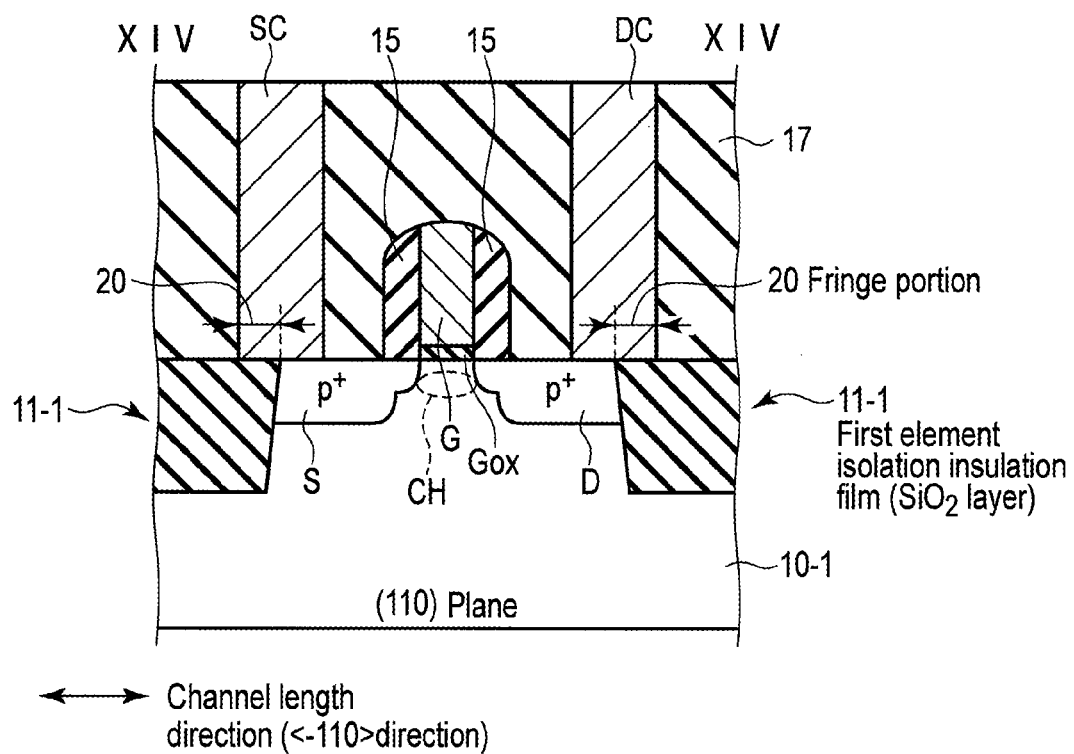
FIG. 14 is a cross-sectional view taken along line XIV-XIV in FIG. 1.

Referring to FIG. 13 and FIG. 14, a description is given of a structure example of the semiconductor device according to the present embodiment.

As shown in FIG. 13 and FIG. 14, the semiconductor device of the present embodiment differs from the semiconductor device shown in FIG. 2 and FIG. 3 in that the semiconductor device of the present embodiment further includes a first element isolation insulation film 11-1 having a positive expansion coefficient. In the present embodiment, a description is given of, for instance, a pMOS transistor which has a channel length direction in the <−110> direction, and is disposed on a semiconductor substrate having an element formation plane in the (110) plane direction.

The pMOS transistor includes a gate insulation film Gox provided on a semiconductor substrate 10-1, a gate electrode G provided on the gate insulation film Gox, a source S and a drain D provided spaced apart in the semiconductor substrate 10-1 in a manner to sandwich the gate electrode G, spacers 15 provided on side walls of the gate electrode G, and contact wiring lines SC and DC. This pMOS transistor is an insulated-gate field-effect transistor having holes, which are doped p-type impurities, as carriers.

The gate insulation film Gox is formed of, for example, a silicon oxide film ($SiO_2$) by a thermal oxidation method.

The gate electrode G is formed of, for example, polysilicon (poly-Si).

The source S and drain D ($p^+$ layer) are formed such that p-type impurities, such as boron (B), are doped, for example, by ion implantation and are thermally diffused. The doped p-type impurities release holes serving as carriers.

The spacers 15 are formed of, e.g. a silicon nitride (SiN) film. The contact wiring lines SC and DC are provided in an interlayer insulation film 17 on the source S and drain D. Parts of the contact wiring lines SC and DC are provided on fringe portions 20 of the first element isolation insulation films 11-1.

The first element isolation insulation film 11-1 is buried in a trench in the element isolation region of the semiconductor substrate 10-1, has a positive expansion coefficient, and applies a compressive stress to the pMOS transistor by operation heat.

The first element isolation insulation film 11-1 has a positive expansion coefficient (positive expansion factor) [$\Delta V/V/\Delta T$] (V: volume, T: temperature, $\Delta T$: volume variation). The positive expansion coefficient, in this context, refers to a ratio at which the volume increases in accordance with an increase in temperature. The above-described compressive stress in this embodiment is, e.g. about several to several-ten GPa. The first element isolation insulation film 11-1 in this embodiment is formed of a silicon oxide film ($SiO_2$ film). Most of substances expand in accordance with an increase in temperature, and thus have positive expansion coefficients. Accordingly, there are many choices of materials having positive expansion coefficients. Any material, which should preferably have a high expansion coefficient and does not adversely affect device performances, is applicable as a buried material of the first element isolation insulation film 11-1. Taking into account the fact that the buried material of the existing element isolation insulation film STI is the silicon oxide film ($SiO_2$ film), it is considered that it is the best solution to add to the silicon oxide film ($SiO_2$ film) such a composition as to increase the expansion coefficient. Other modes of the buried material may include an amorphous mode and a mode in which the composition of glass ceramics is varied. Aside from the silicon oxide film ($SiO_2$ film), use may be made of buried materials with positive expansion coefficients, such as an aluminum oxide film ($Al_2O_3$ film) and an aluminum nitride film (AlN film), which have large thermal expansion coefficients and large elastic coefficients.

<Application of Stress at Time of Driving Operation>

Figure 15:
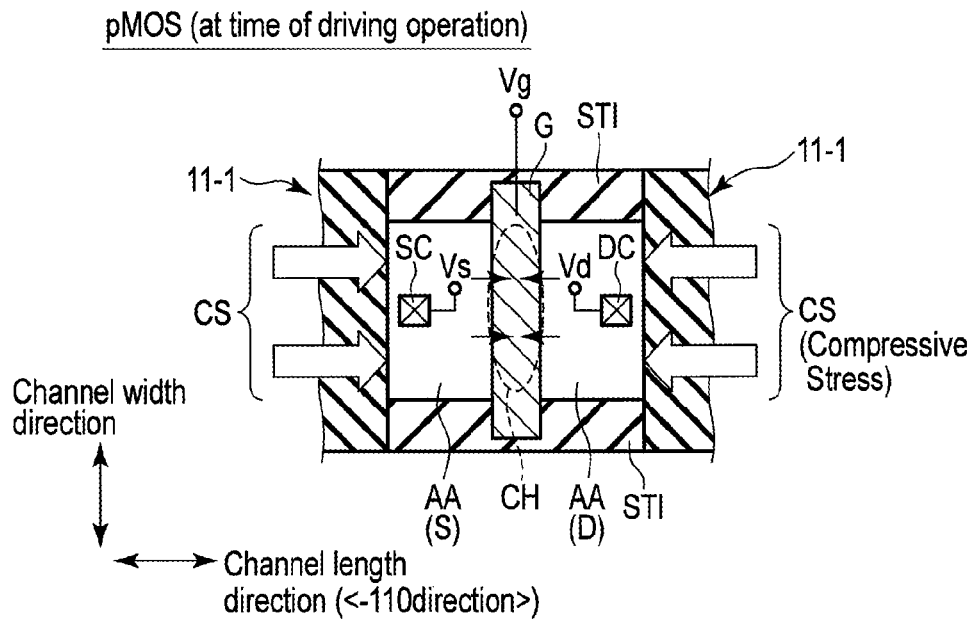
FIG. 15 is a plan view for explaining the driving operation of the semiconductor device according to the first embodiment.
Figure 16:
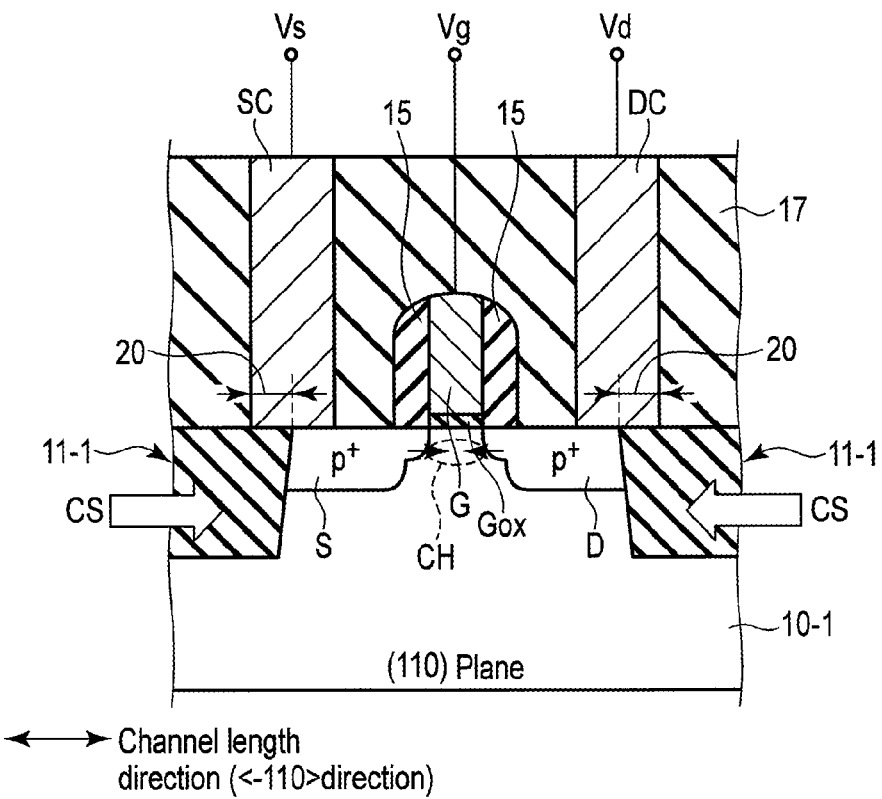
FIG. 16 is a cross-sectional view for explaining the driving operation of the semiconductor device according to the first embodiment.

Next, referring to FIG. 15 and FIG. 16, a description is given of the application of stress at the time of the driving operation of the semiconductor device according to the first embodiment.

As shown in FIG. 15 and FIG. 16, in the above-described structure, when the pMOS transistor is driven, a source voltage Vs, a drain voltage Vd and a predetermined gate voltage Vg are applied. Then, holes, which are carriers, move in the channel CH which is formed in the semiconductor substrate 10-1 below the gate electrode G. Thereby, the holes flow between the source S and drain D, and a switching operation is performed. At this time, operation heat is produced by the application voltage, such as the drain voltage Vd, and the switching current.

If the operation heat is conducted to the first element isolation insulation layer 11-1, the first element isolation insulation layer 11-1 expands in accordance with its own positive expansion coefficient. Accordingly, a compressive stress CS occurs along the channel length direction. The compressive stress CS is, e.g. about several to several-ten GPa.

Hence, even in the case where the temperature of the semiconductor substrate 10-1, for instance, rises to high temperatures, the mobility of holes, which are carriers of the pMOS transistor, can be increased. This is clear from the result of the study in the lower parts of FIG. 5 and FIG. 6 in the above sections 2-2 and 2-3.

In the case of this embodiment, parts of the contact wiring lines SC and DC are provided on the fringe portions 20 of the first element isolation insulation films 11-1. Thus, also because the operation heat occurring in the contact wiring lines SC and DC is directly conducted to the first element isolation insulation films 11-1, the mobility of holes can advantageously be improved.

Needless to say, the same operation can be obtained, not only by the above-described operation heat occurring due to the driving operation of the pMOS transistor, but also by the operation heat, in a broader sense, occurring when the LSI including this pMOS transistor is operated.

<Manufacturing Method>

Next, a description is given of a method of manufacturing the semiconductor device according to the first embodiment of the invention.

Although not shown, a trench for element isolation is formed in an element isolation region of the semiconductor substrate 10-1, for example, by using RIE. Then, a silicon oxide ($SiO_2$) film having a positive expansion coefficient, for instance, is buried in the trench by, e.g. CVD, and a first element isolation insulation film 11-1 is formed.

As has been described above, most of substances expand in accordance with an increase in temperature, and thus have positive expansion coefficients. Accordingly, there are many choices of materials having positive expansion coefficients. Any material, which should preferably have a high expansion coefficient and does not adversely affect device performances, is applicable as a buried material of the first element isolation insulation film 11-1 in the present invention. Other modes of the buried material may include an amorphous mode and a mode in which the composition of the glass ceramics is varied. Aside from the silicon oxide film ($SiO_2$ film), use may be made of buried materials with positive expansion coefficients, such as an aluminum oxide film ($Al_2O_3$ film) and an aluminum nitride film (AlN film), which have large thermal expansion coefficients and large elastic coefficients.

Subsequently, by using an ordinary LSI manufacturing process, the semiconductor device according to the present embodiment is manufactured.

<Advantageous Effects>

With the semiconductor device and the manufacturing method thereof according to the present embodiment of the invention, at least the same advantageous effects as described above can be obtained. In addition, at least the following advantageous effect (1) can be obtained.

(1) As the temperature of the LSI rises from room temperature to higher temperatures (e.g. about 200° C.), the mobility of holes, which are carriers, can be increased.

As has been described above, when the operation heat, which occurs when the pMOS transistor is operated, is conducted to the first element isolation insulation film 11-1, the first element isolation insulation film 11-1 expands in accordance with its own positive expansion coefficient. Accordingly, a compressive stress CS occurs in the first element isolation insulation layer 11-1 along the channel length direction (<−110>). As a result, the compressive stress can be applied to the channel region CH along the channel length direction.

Thus, even in the case where the temperature of the semiconductor substrate 10-1, for instance, rises up to high temperatures, the mobility of holes of the pMOS transistor can be improved.

In addition, since the compressive stress CS becomes higher as the temperature rises, the effect of the improvement in mobility of holes is more conspicuous as the temperature becomes higher. This is clear from the result of the study in the lower parts of FIG. 5 and FIG. 6 in the above sections 2-2 and 2-3.

Moreover, since the volume of the first element isolation insulation layer 11-1 expands in proportion to the rise in temperature, the compressive stress that is proportional to the rise in temperature can be applied to the channel region CH. Hence, even in the case where the temperature of the LSI, for instance, including the pMOS transistor rises and there occurs a more intensified thermal disturbance of silicon, etc., a decrease in mobility of holes can be prevented. As a result, under the circumstances in which the temperature of the LSI, for instance, increases due to microfabrication of transistors in recent years, the degradation in characteristics of transistors can very advantageously be prevented.

[Second Embodiment (An Example in which Tensile Stress is Applied by a Device Isolation Insulation Film (Negative Expansion Coefficient)]

Next, referring to FIG. 17 to FIG. 20, a semiconductor device according to a second embodiment of the present invention is described. This embodiment relates to an example in which tensile stress is applied in one axial direction by an element isolation insulation film having a negative expansion coefficient according to the above section 4-1. A detailed description of the parts common to those in the first embodiment is omitted here.

<Structure Example>

Figure 17:
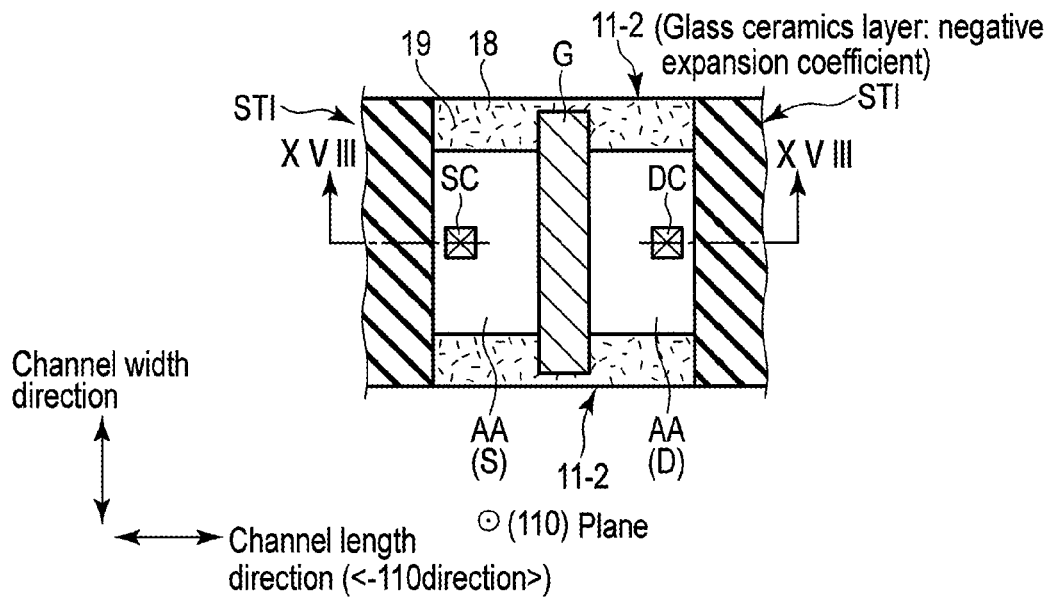
FIG. 17 is a plan view showing a semiconductor device according to a second embodiment of the present invention.
Figure 18:
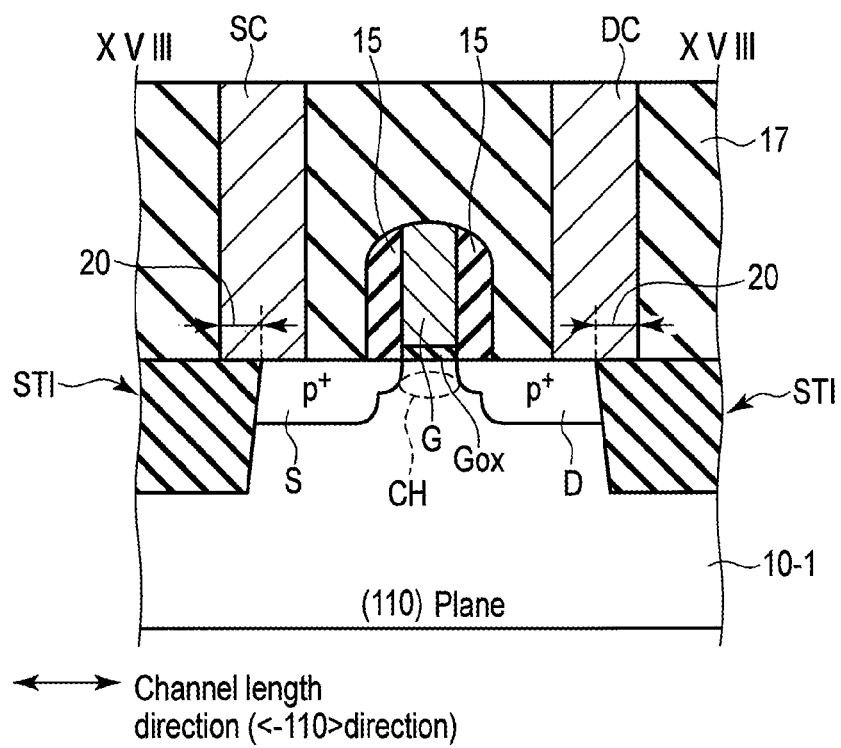
FIG. 18 is a cross-sectional view taken along line XVIII-XVIII in FIG. 17.

Referring to FIG. 17 and FIG. 18, a description is given of a structure example of the semiconductor device according to the second embodiment of the invention. As shown in FIG. 17 and FIG. 18, the semiconductor device of the present embodiment differs from the semiconductor device of the first embodiment in that a second element isolation insulation film 11-2 having a negative expansion coefficient is further buried and disposed in an element isolation region along the channel length direction.

In the present embodiment, a description is given of, for instance, a pMOS transistor which has a channel length direction in the <−110> direction, and is disposed on a semiconductor substrate 10-1 having an element formation plane in the (110) plane direction.

The pMOS transistor includes a gate insulation film Gox provided on the semiconductor substrate 10-1, a gate electrode G provided on the gate insulation film Gox, a source S and a drain D provided spaced apart in the semiconductor substrate 10-1 in a manner to sandwich the gate electrode G, spacers 15 provided on side walls of the gate electrode G, and contact wiring lines SC and DC. This pMOS transistor is an insulated-gate field-effect transistor having holes, which are doped p-type impurities, as carriers.

The source S and drain D ($p^+$ layer) are formed such that p-type impurities are doped and thermally diffused. The doped p-type impurities release holes serving as carriers.

The spacers 15 are formed of, e.g. a silicon nitride (SiN) film.

The contact wiring lines SC and DC are provided in an interlayer insulation film 17 on the source S and drain D. Parts of the contact wiring lines SC and DC are provided on fringe portions 20 of the first element isolation insulation films 11-1.

The second element isolation insulation film 11-2 is buried in a trench in the element isolation region of the semiconductor substrate 10-1, has a negative expansion coefficient, and applies a tensile stress to the pMOS transistor by operation heat.

The negative expansion coefficient (negative expansion factor) [$\Delta V/V/\Delta T$] (V: volume, T: temperature, $\Delta T$: volume variation) refers to a ratio at which the volume decreases in accordance with an increase in temperature. The expansion coefficient of the second element isolation insulation film 11-2 is, for example, about $-8 \times 10^{-6}$/K.

The second element isolation insulation film 11-2 in this embodiment is a glass ceramics layer including an amorphous matrix layer 18, and crystal lines 19 which are dispersed in the amorphous matrix layer 18. The composition of the glass ceramics layer may be any combination of four compositions, i.e. $Li_2O$—$Al_2O_3$—$SiO_2$—$TiO2$, which can make the glass ceramics layer transition into a glass state.

The crystal lines 19 have a negative expansion coefficient, and the amorphous matrix layer 18 has a positive expansion coefficient. Thus, it is desirable that the ratio of the crystal lines 19 in the entire second element isolation insulation film 11-2 be greater than the ratio of the amorphous matrix layer 18 in the entire second element isolation insulation film 11-2.

As will be described later, when the device, such as the pMOS transistor, operates, the second element isolation insulation film 11-2 contracts in accordance with the rise in temperature by the operation heat of the device. As a result, a tensile stress is applied to the channel region CH along the channel length direction, the mobility of holes is enhanced, and the characteristics of the pMOS transistor can advantageously be improved. For example, in the present embodiment, the tensile stress is about 80 to 100 GPa.

The method of fabricating the second device isolation insulation film 11-2 will be described in detail in connection with a third embodiment of the invention that is to be described later.

<Application of Stress at Time of Driving Operation>

Figure 19:
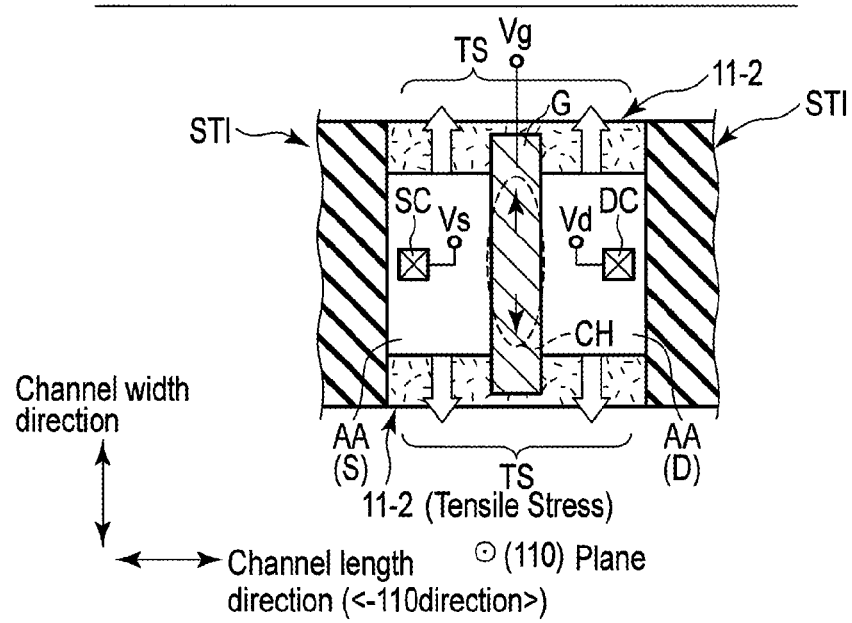
FIG. 19 is a plan view for explaining the driving operation of the semiconductor device according to the second embodiment.
Figure 20:
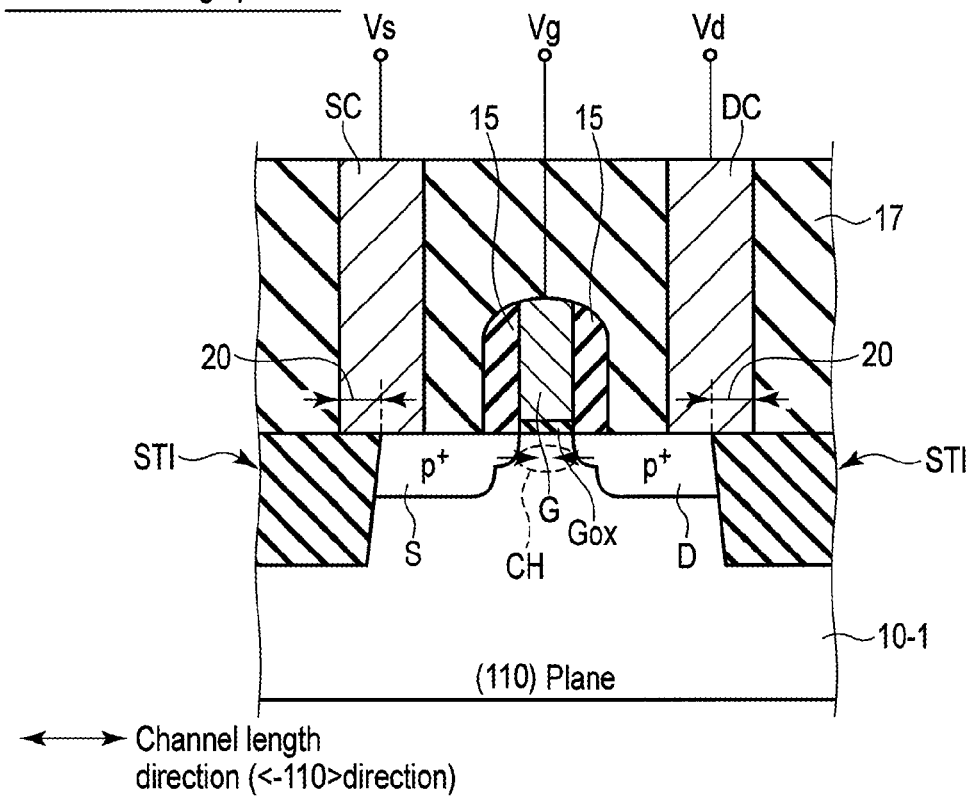
FIG. 20 is a cross-sectional view for explaining the driving operation of the semiconductor device according to the second embodiment.

Next, referring to FIG. 19 and FIG. 20, a description is given of the application of stress at the time of the driving operation of the semiconductor device according to the second embodiment of the invention.

As shown in FIG. 19 and FIG. 20, in the above-described structure, when the pMOS transistor is driven, a source voltage Vs, a drain voltage Vd and a predetermined positive gate voltage Vg are applied. Then, holes, which are carriers, move in the channel CH which is formed in the semiconductor substrate 10-1 below the gate electrode G, and flow between the source S and drain D. Thus, a switching operation is performed. At this time, operation heat is produced by the application voltage, such as the drain voltage Vd, and the switching current.

If the operation heat is conducted to the second element isolation insulation layer 11-2, the second element isolation insulation layer 11-2 contracts in accordance with its own negative expansion coefficient. Accordingly, a tensile stress TS occurs along the channel width direction. As a result, the tensile stress is applied to the channel region CH in the channel width direction. The tensile stress TS is, e.g. about 80 to 100 GPa.

Hence, even in the case where the temperature of the semiconductor substrate 10-1, for instance, rises to high temperatures, the mobility of holes, which are carriers of the pMOS transistor, can advantageously be increased. This is clear from the result of the study shown in FIG. 4 in the above section 4-1.

Needless to say, the same operation can be obtained, not only by the above-described operation heat occurring due to the driving operation of the pMOS transistor, but also by the operation heat, in a broader sense, occurring when the LSI including this pMOS transistor is operated.

In the present embodiment, the p-type transistor has been exemplified, but the conductivity type of the transistor is not limited to the p-type. Also in the case where the embodiment is applied to an n-type MOS transistor, the mobility of electrons which are carriers can advantageously be improved.

[Third Embodiment (An Example of Application of Biaxial Stress by Element Isolation Insulation Films (Positive and Negative Expansion Coefficients)]

Next, referring to FIG. 21 to FIG. 31, a description is given of a semiconductor device and a manufacturing method thereof according to a third embodiment of the invention. The third embodiment relates to an example in which stress is applied in two axial directions by element isolation insulation films having positive and negative expansion coefficients according to the above section 4-1. A detailed description of parts common to those of the first embodiment is omitted here.

<Structure Example>

Referring to FIG. 21 and FIG. 22, a structure example of the semiconductor device of the third embodiment of the invention is described. As shown in FIG. 21 and FIG. 22, the semiconductor device of the third embodiment differs from that of the first embodiment in that a second element isolation insulation film 11-2 having a negative expansion coefficient is also buried and disposed. In other words, in the present embodiment, the second element isolation insulation film 11-2 having a negative expansion coefficient is disposed along the channel length direction and the first element isolation insulation film 11-1 having a positive expansion coefficient is disposed along the channel width direction in the semiconductor substrate 10-1 in the element isolation insulation region in a manner to surround an nMOS transistor.

In the present embodiment, a description is given of, for instance, an nMOS transistor which has a channel length direction in the <100> direction, and is disposed on the semiconductor substrate 10-1 having an element formation plane in the (100) plane direction.

The nMOS transistor includes a gate insulation film Gox provided on the semiconductor substrate 10-1, a gate electrode G provided on the gate insulation film Gox, a source S and a drain D provided spaced apart in the semiconductor substrate 10-1 in a manner to sandwich the gate electrode G, spacers 15 provided on side walls of the gate electrode G, and contact wiring lines SC and DC. This nMOS transistor is an insulated-gate field-effect transistor having electrons, which are doped n-type impurities, as carriers.

The source S and drain D ($n^+$ layer) are formed such that n-type impurities, such as phosphorus (P), arsenic (As) or antimony (Sb), are doped in the semiconductor substrate 10-1, for example, by ion implantation and are thermally diffused. The doped n-type impurities release free electrons serving as carriers.

The spacers 15 are formed of, e.g. a silicon nitride (SiN) film.

The contact wiring lines SC and DC are provided in an interlayer insulation film 17 on the source S and drain D. Parts of the contact wiring lines SC and DC are provided on fringe portions 20 of the first element isolation insulation films 11-1.

The second element isolation insulation film 11-2 is buried in a trench in the element isolation region of the semiconductor substrate 10-1, has a negative expansion coefficient, and applies a tensile stress to the nMOS transistor by operation heat.

The negative expansion coefficient (negative expansion factor) [$\Delta V/V/\Delta T$] (V: volume, T: temperature, $\Delta T$: volume variation) refers to a ratio at which the volume decreases in accordance with an increase in temperature. The expansion coefficient of the second element isolation insulation film 11-2 is, for example, about $-8\times10^{-6}$/K.

The second element isolation insulation film 11-2 in this embodiment is a glass ceramics layer including an amorphous matrix layer 18, and crystal lines 19 which are dispersed in the amorphous matrix layer 18. The composition of the glass ceramics layer may be any combination of four compositions, i.e. $Li_2O$—$Al_2O_3$—$SiO_2$—$TiO2$, which can make the glass ceramics layer transition into a glass state.

The crystal lines 19 have a negative expansion coefficient, and the amorphous matrix layer 18 has a positive expansion coefficient. Thus, it is desirable that the ratio of the crystal lines 19 in the entire second element isolation insulation film 11-2 be greater than the ratio of the amorphous matrix layer 18 in the entire second element isolation insulation film 11-2.

As will be described later, when the device, such as the nMOS transistor, operates, the second element isolation insulation film 11-2 contracts in accordance with the rise in temperature by the operation heat of the device. As a result, a tensile stress is applied to the channel region CH along the channel length direction, the mobility of electrons is enhanced, and the characteristics of the nMOS transistor can advantageously be improved. For example, in the present embodiment, the tensile stress is about 80 to 100 GPa.

<Application of Stress at Time of Driving Operation>

Figure 23:
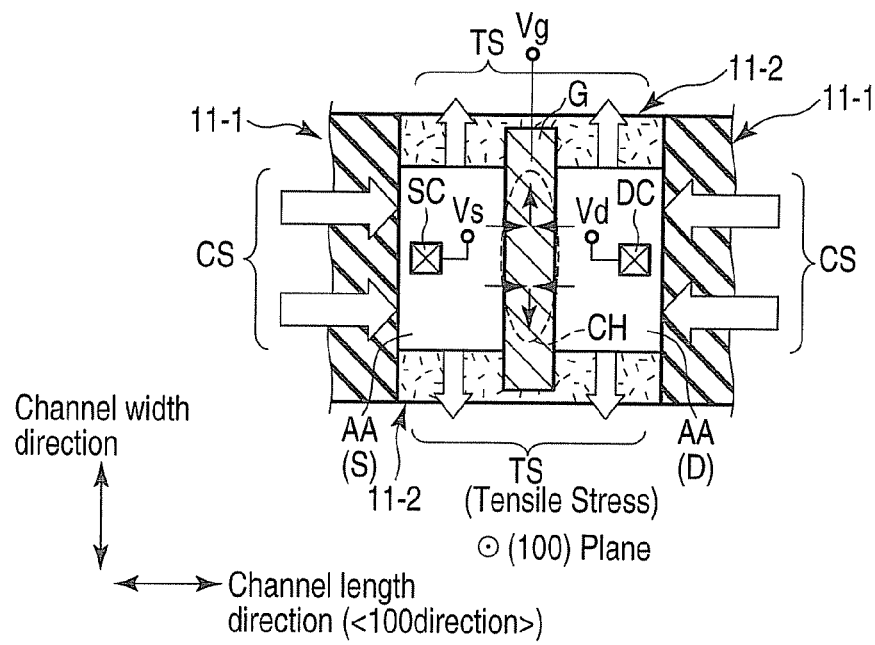
FIG. 23 is a plan view for explaining the driving operation of the semiconductor device according to the third embodiment.
Figure 24:
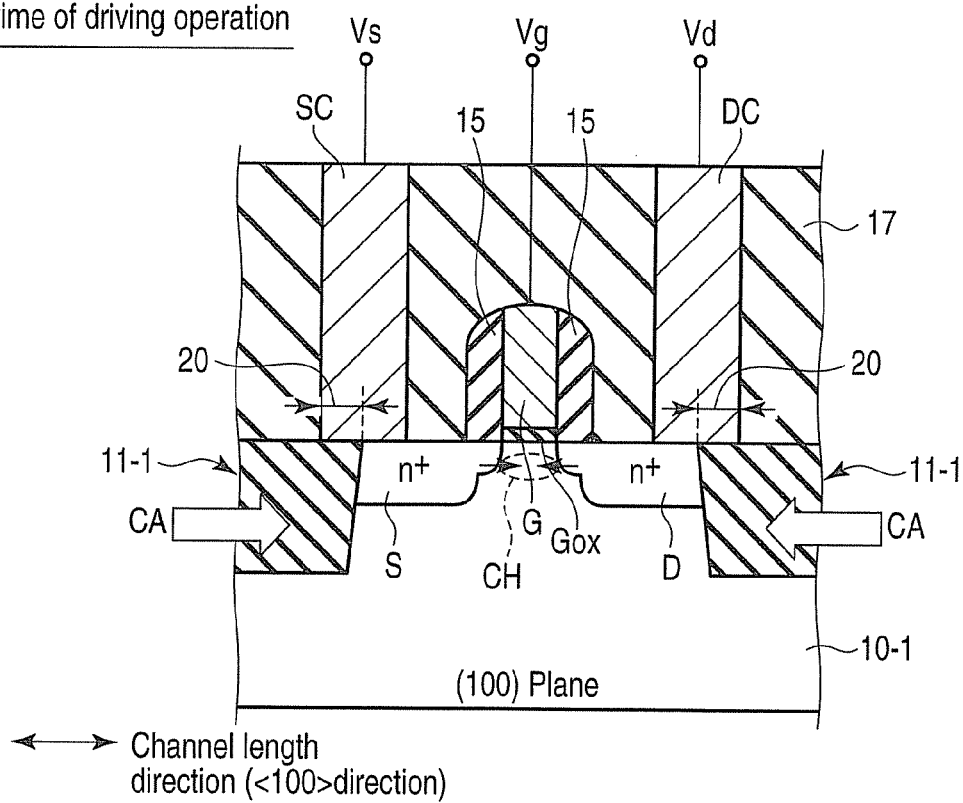
FIG. 24 is a cross-sectional view for explaining the driving operation of the semiconductor device according to the third embodiment.
Figure 25:
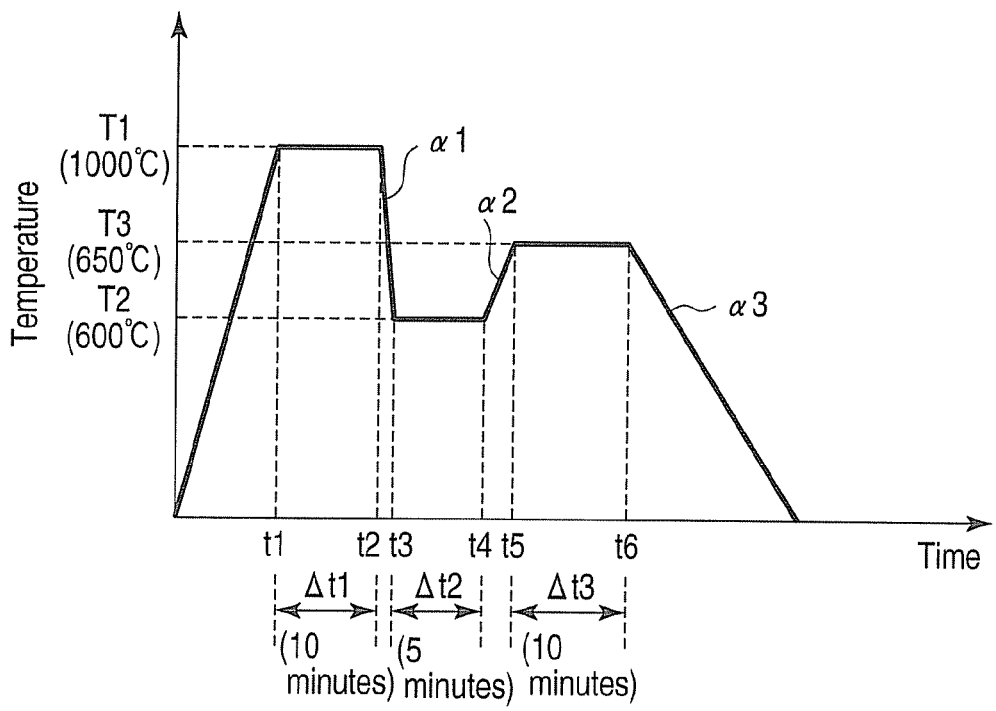
FIG. 25 is a timing chart showing the relationship between the time and temperature according to the third embodiment.

Next, referring to FIG. 23 and FIG. 24, a description is given of the application of stress at the time of the driving operation of the semiconductor device according to the third embodiment of the invention.

As shown in FIG. 23 and FIG. 24, in the above-described structure, when the nMOS transistor is driven, a source voltage Vs, a drain voltage Vd and a predetermined positive gate voltage Vg are applied. Then, electrons, which are carriers, move in the channel CH which is formed in the semiconductor substrate 10-1 below the gate electrode G. Thereby, the electrons flow between the source S and drain D, and a switching operation is performed. At this time, operation heat is produced by the application voltage, such as the drain voltage Vd, and the switching current.

If the operation heat is conducted to the second element isolation insulation layer 11-2, the second element isolation insulation layer 11-2 contracts in accordance with its own negative expansion coefficient. Accordingly, a tensile stress TS occurs in the second element isolation insulation layer 11-2 along the channel width direction. As a result, the tensile stress is applied to the channel region CH along the channel width direction. The tensile stress TS is, e.g. about 80 to 100 GPa.

At the same time, a compressive stress CS is applied to the channel CH by the thermal expansion of the first element isolation insulation film 11-1. Thus, the compressive force CS along the channel length direction <110> and the tensile stress TS along the channel width direction occur at the same time. As a result, a stronger compressive stress and a stronger tensile stress are applied at the same time to the channel region CH in the two axial directions that are the channel length direction and channel width direction.

Thus, even in the case where the temperature of the semiconductor substrate 10-1, etc. rises up to high temperatures, the mobility of electrons, which are carriers of the nMOS transistor, can advantageously be further improved.

As a result, even when the temperature of the semiconductor substrate 10-1, etc. rises up to high temperatures, the mobility of electrons, which are carriers of the nMOS transistor, can be increased. This is clear from the result of the study shown in FIG. 4 to FIG. 6, and FIG. 9 in the above sections 2-1, 2-3 and 4-1.

In the case of this embodiment, parts of the contact wiring lines SC and DC are provided on the fringe portions 20 of the first element isolation insulation films 11-1. Thus, also because the operation heat occurring in the contact wiring lines SC and DC is directly conducted to the first element isolation insulation films 11-1, the mobility of electrons can advantageously be improved.

Needless to say, the same operation can be obtained, not only by the above-described operation heat occurring due to the driving operation of the nMOS transistor, but also by the operation heat, in a broader sense, occurring when the LSI including this nMOS transistor is operated.

<Manufacturing Method>

Next, referring to FIG. 26 to FIG. 31, a description is given of a method of manufacturing the semiconductor device according to the third embodiment. The description below is given on the basis of the timing chart of FIG. 25.

To begin with, p-type impurities, such as phosphorus (P), are doped in the semiconductor substrate 10-1 having the element formation plane in the (100) plane direction, and a p-well is formed (not shown).

Figure 26:
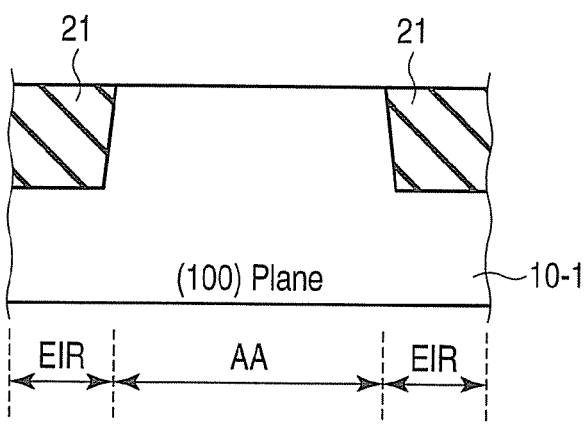
FIG. 26 is a cross-sectional view illustrating a fabrication step of the semiconductor device according to the third embodiment.

Then, as shown in FIG. 26, a trench for element isolation is formed in an element isolation region EIR of the semiconductor substrate 10-1, for example, by using RIE (Reactive Ion Etching). A silicon oxide ($SiO_2$) film, for instance, is buried in the trench by, e.g. CVD (Chemical Vapor Deposition), and a silicon oxide film 21 is formed.

Figure 27:
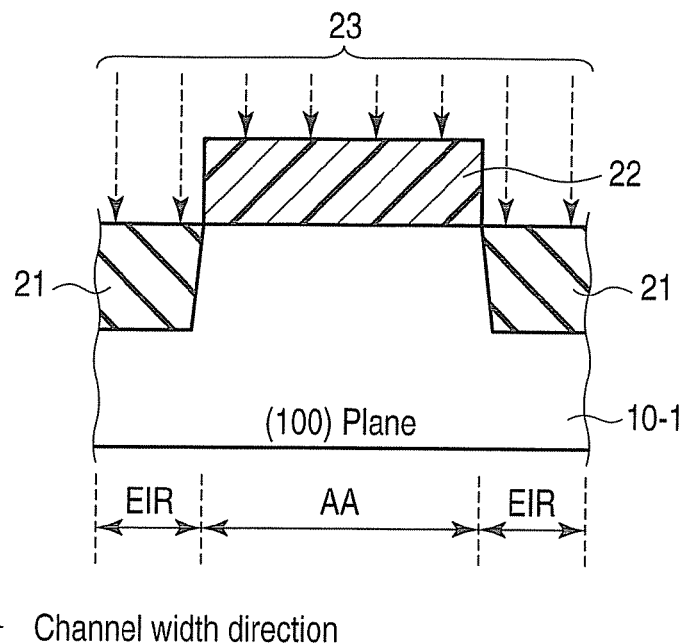
FIG. 27 is a cross-sectional view illustrating a fabrication step of the semiconductor device according to the third embodiment.

Subsequently, as shown in FIG. 27, a photoresist, for instance, is coated on the semiconductor substrate 10-1, and the photoresist is exposed and developed. Thereby, the photoresist is left on an active area AA, and a mask layer 22 is formed.

Using the mask layer 22 as a mask, crystal seeds 23 of ions of, e.g. lithium (Li), aluminum (Al) or titanium (Ti), are doped in the silicon oxide film 21 by, e.g. ion implantation.

Figure 28:
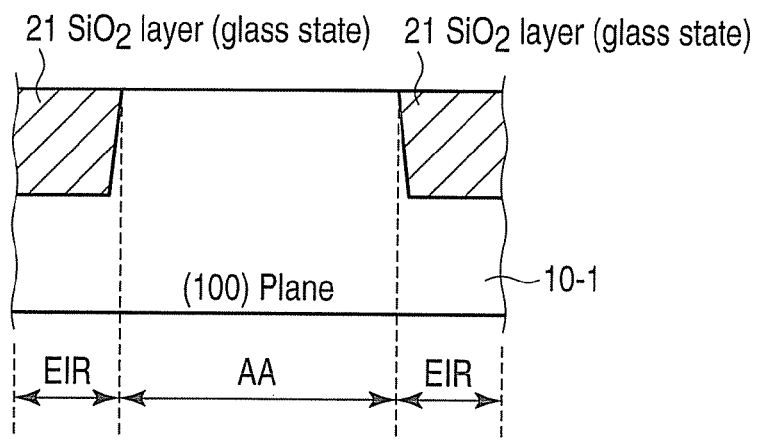
FIG. 28 is a cross-sectional view illustrating a fabrication step of the semiconductor device according to the third embodiment.

Then, as shown in FIG. 28, the mask layer 22 is removed, and heat treatment is performed, for example, in an oxidizing atmosphere during a time $\Delta t1$ (e.g. about 10 minutes) between time points t1 and t2 at a temperature T1 (e.g. about 1000° C.). Thereby, the silicon oxide film 21 is made to transition into a glass state (amorphous state).

Subsequently, at time point t2, the resultant structure is cooled to a temperature T2 (e.g. about 600° C.) at a temperature-lowering rate $\alpha 1$. Preferably, the rate $\alpha 1$ should be as high as possible.

Figure 29:
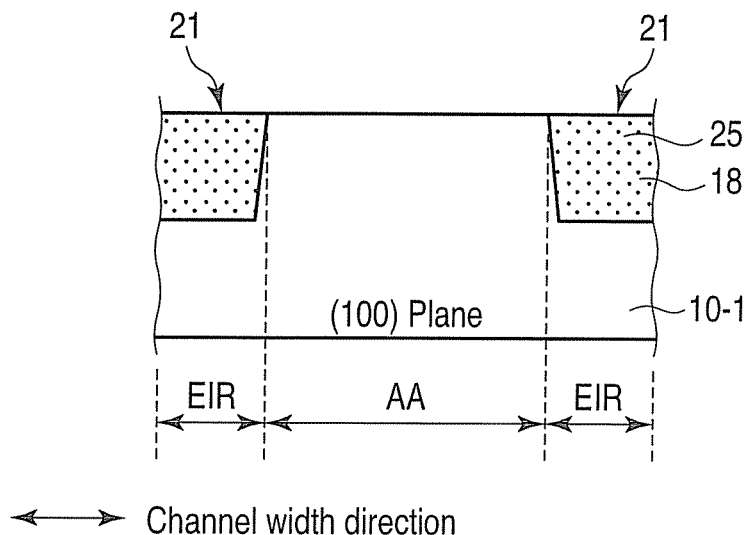
FIG. 29 is a cross-sectional view illustrating a fabrication step of the semiconductor device according to the third embodiment.

Then, as shown in FIG. 29, the silicon oxide film 21, which is in the glass state, is annealed during a time $\Delta t2$ (e.g. about 5 minutes) between time points t3 and t4 at a temperature T2 (e.g. about 600° C.). Crystal nuclei 25 are precipitated at high density in the amorphous matrix layer 18 in the silicon oxide film 21. The size of each crystal nucleus 25 is, e.g. about several nm (nanometers).

In the above process (time points t3 to t4), the temperature, at which the heat treatment is conducted, should preferably be the temperature T2 (about 600° C. in this embodiment) at which the crystal nuclei 25 are precipitated at the highest rate. Specifically, as indicated by a solid line 31 in FIG. 31, since the rate of precipitation of crystal nuclei 25 is the highest rate V1 at the temperature T2, the crystal nuclei 25 can be formed at high density in a short time.

At time point t4, the temperature of the amorphous matrix layer 18 including the crystal nuclei 25 is raised to a temperature T3 (e.g. about 650° C.) at a temperature-raising rate $\alpha 2$. Preferably, the temperature-raising rate $\alpha 2$ should be as high as possible in order to prevent non-uniform growth of the crystal nuclei 25.

Figure 30:
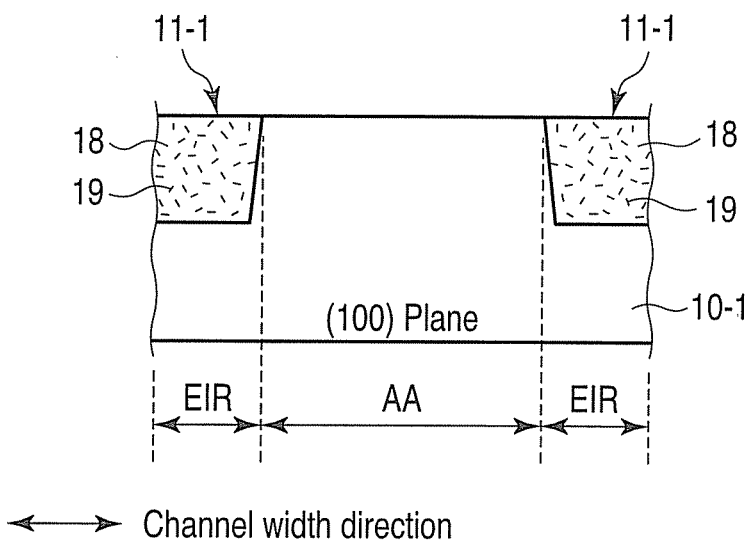
FIG. 30 is a cross-sectional view illustrating a fabrication step of the semiconductor device according to the third embodiment.

Subsequently, as shown in FIG. 30, the amorphous matrix layer 18 including the crystal nuclei 25 is annealed during a time $\Delta t3$ (e.g. about 10 minutes) between time points t5 and t6 at a temperature T3 (e.g. about 650° C.). Thereby, the crystal nuclei 25 are grown, and the crystal lines 19 are formed. At the same time, by growing the crystal nuclei 25 and forming the crystal lines 19, the ions (crystal seeds) 23, which are doped in the amorphous matrix layer 18 by the ion implantation, are sufficiently precipitated. As a result, the second element isolation insulation film 11-2 can be formed of the glass ceramics layer including the amorphous matrix layer 18 and crystal lines 19. The size of the crystal line 19 is, e.g. several nm to several-ten nm.

In the above process (time points t5 to t6), it is preferable that the temperature for annealing be the temperature T3 at which the crystal nuclei 25 grow at the highest rate. Specifically, as indicated by a solid line 32 in FIG. 31, the rate of growth of crystal nuclei 25 is the highest rate V2 at the temperature T3, and the crystal nuclei 25 grow in a short time.

Figure 31:
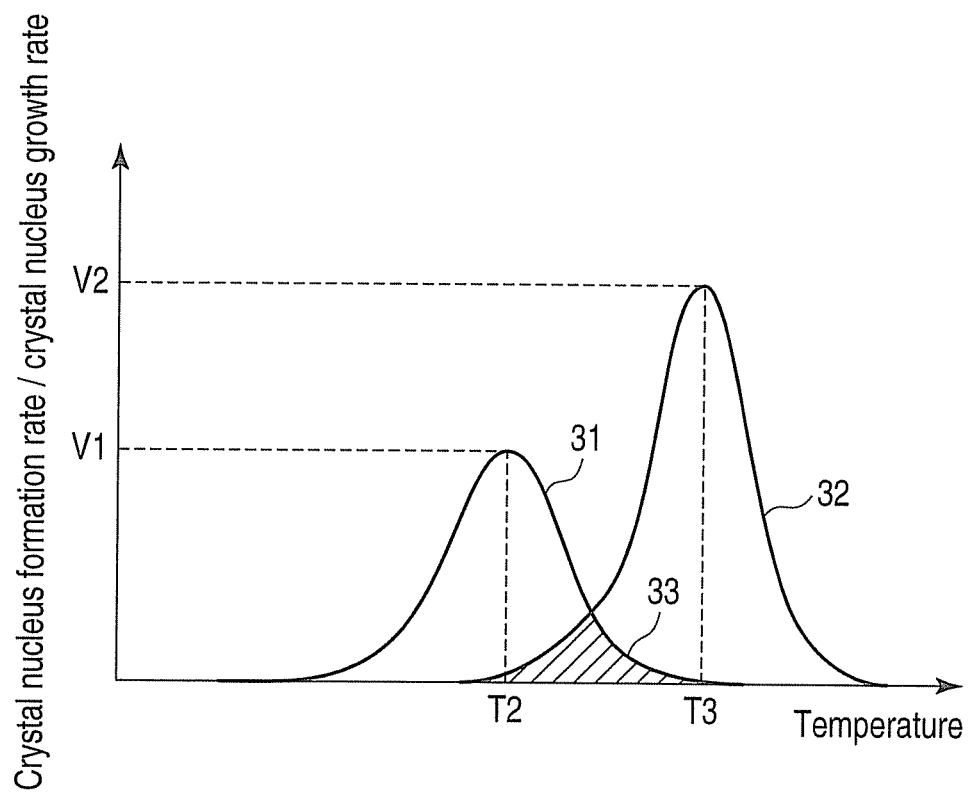
FIG. 31 is a graph showing the relationship between the temperature and the crystal nucleus formation rate/crystal nucleus growth rate according to the third embodiment.

It is not desirable to perform annealing in a region 33 surrounded by solid lines 31 and 32 in FIG. 31. The reason for this is that in the region 33 the density of crystal nuclei 25 becomes low, and sufficient growth cannot be achieved.

At time point t6, the first element isolation insulation film 11-1 is cooled down to room temperature or thereabout at a temperature-lowering rate α3. It is desirable that the rate α3 be as low as possible, in order to relax the internal stress which has occurred due to the crystal growth.

By the above-described process, the second element isolation insulation film 11-2, which is formed of the glass ceramics (pyroceramics) layer, can be fabricated. The composition of the glass ceramics shown in the present embodiment is merely an example, and it is possible to adopt any composition, such as a combination of $Li_2O$—$Al_2O_3$—$SiO_2$—$TiO2$, which can realize an amorphous state.

Although not shown, a gate insulation film Gox is formed in the active area AA on the semiconductor substrate 12, for example, by thermal oxidation. A gate electrode G is formed on the gate insulation film Gox in a direction perpendicular to the <100> direction such that the channel length direction becomes the <100> direction. Spacers 15 are formed on side walls of the gate electrode G. Then, using the gate electrode G and spacers 15 as a mask, n-type impurities are doped in the semiconductor substrate 10-1, and a source S and a drain D are formed. Subsequently, an interlayer insulation film 17 is formed so as to cover the gate electrode G.

Thereafter, contact holes are formed in the interlayer insulation film 17 on the source S and drain D, and a polysilicon layer, for instance, is buried in the contact holes. Thereby, contact wiring lines SC and DC are formed. When the contact holes are formed, it is preferable to form the contact holes such that parts of the contact holes come in contact with the fringe portions 20 of the first element isolation insulation film 11-1.

By the above-described process, the semiconductor device according to the third embodiment is formed.

<Advantageous Effects>

With the semiconductor device and the manufacturing method thereof according to the third embodiment, at least the following advantageous effects (2) to (6) can be obtained.

(2) As the temperature of the LSI rises from room temperature to higher temperatures (e.g. about 200° C.), the mobility of electrons (or holes), which are carriers, can be improved.

As has been described above, when the operation heat, which occurs when the nMOS transistor is operated, is conducted to the first and second element isolation insulation films 11-1 and 11-2, the compressive stress CS occurs along the channel length direction <100>, and also the tensile stress TS occurs along the channel width direction <001>. As a result, the tensile stress is further applied to the channel region CH along the channel width direction.

Thus, the compressive force CS along the channel length direction and the tensile stress TS along the channel width direction occur at the same time. As a result, a stronger compressive stress and a stronger tensile stress are applied at the same time to the channel region CH in the two axial directions that are the channel length direction and channel width direction.

Thus, even in the case where the temperature of the semiconductor substrate 10-1, for instance, rises up to high temperatures (the mobility of electrons, which are carriers of the nMOS transistor, can advantageously be improved.

In addition, since the tensile stress TS becomes higher as the temperature rises, the effect of the improvement in mobility of electrons is more conspicuous as the temperature becomes higher.

Moreover, since the volume of the first element isolation insulation layer 11-1 expands in proportion to the rise in temperature, the compressive stress that is proportional to the rise in temperature can be applied to the channel region CH.

Hence, even in the case where the temperature of the LSI, for instance, including the nMOS transistor rises and there occurs a more intensified thermal disturbance of silicon, etc., a decrease in mobility of electrons can be prevented. As a result, under the circumstances in which the temperature of the LSI, for instance, increases due to microfabrication of transistors in recent years, the degradation in characteristics of transistors can very advantageously be prevented.

In the case of the present embodiment, parts of the contact wiring lines SC and DC are provided on the fringe portions 20 of the first element isolation insulation films 11-1. Thus, also because the operation heat occurring in the contact wiring lines SC and DC is directly conducted to the first element isolation insulation films 11-1, the mobility of electrons can advantageously be improved.

In the present embodiment, the n-type MOS transistor has been exemplified in the description of the advantageous effect that is obtained by applying at the same time the tensile stress and compressive stress to the channel region CH in the two mutually perpendicular axial directions. The type of the MOS transistor, however, is not limited to the n-type MOS transistor. The mobility of holes, which are carriers of a pMOS transistor, can be improved even in the case where the tensile stress and compressive stress are applied at the same time to the channel region CH of the pMOS transistor in the two perpendicular axial directions. This is clear from the conclusion of the study shown in FIG. 9. This embodiment is also advantageous in that the conductivity type of the transistor is not limited.

(3) The optimal mobility of electrons of the nMOS transistor can be selected.

The magnitudes of the compressive stress CS and tensile stress TS that are applied to the channel region CH increase in proportion to, e.g. the volumes of the first and second element isolation insulation film 11-1 and 11-2.

Thus, the optimal mobility of electrons of the nMOS transistor can advantageously be selected by selecting, for example, when the silicon oxide film 21 is formed (FIG. 26), the depth of the trench for element isolation and controlling the volume of the silicon oxide film 21 that is buried in the trench, thereby selecting the optimal volume, for instance.

(4) Since the expansion coefficient of the second element isolation insulation film 11-2 can be controlled in a wide range by properly selecting the heat treatment process, the negative expansion coefficient that is optimal for the actual device can be selected.

As shown in FIG. 31, the second element isolation insulation film 11-2 has two temperature regions, that is, the temperature region indicated by the solid line 31 where the crystal nuclei 25 are formed, and the temperature region indicated by the solid line 32 where the crystal nuclei 25 are grown. Accordingly, for example, if a heat treatment process is performed at low temperatures in the temperature region indicated by the solid line 31, and a heat treatment process is performed at the temperature T3, at which the growth rate of crystal nuclei is highest, in the temperature region indicated by the solid line 32, the second element isolation insulation film 11-2 with a relatively low expansion coefficient can be formed.

As has been described above, since various combinations of the temperatures (e.g. T2, T3) of the temperature regions indicated by the solid lines 31 and 32 and the time periods (e.g. Δt2, Δt3) can be selected at the time of performing the heat treatment process (FIG. 26 to FIG. 29), the crystal lines 19 and amorphous matrix layer 18 can be formed with various densities and sizes. Therefore, advantageously, the margin of the expansion coefficient can be increased, and the second element isolation insulation film 11-2 having a target expansion coefficient can easily be formed.

In addition, at the time of performing the ion implantation process (FIG. 27), the necessary expansion coefficient can be controlled by selecting the kind, composition and dosage of the crystal seeds 23.

As described above, even if the composition, etc. are the same, optimal conditions can be variously selected at the time of the heat treatment process (FIG. 26 to FIG. 29) or the ion implantation process (FIG. 27), and the expansion coefficient can be controlled in a wide range according to purposes.

(5) To be more specific, if the temperatures T2 and T3, and the time Δt2> time Δt3, are selected, it is possible to form the second element isolation insulation film 11-2 which has a large negative expansion coefficient and can apply a large tensile stress TS.

One aspect of the insulation layer, which functions to apply a greater tensile stress to the channel region CH, is that the insulation layer has a higher negative expansion coefficient. To achieve this, it is desirable that the crystal lines 19 be closely formed with a higher density. If the time Δt2 is increased, the density of the crystal nuclei 25 can be increased, and if the time Δt3 is increased, each crystal nucleus 25 can be largely grown and a larger crystal line 19 can be formed.

Accordingly, in the case where the temperatures T2 and T3 are selected as in the present embodiment, both the temperatures T2 and T3 are temperatures at which the formation rate and growth rate of crystal nuclei take the maximum values (FIG. 31). Thus, by making the time Δt2 greater than the time Δt3 (time Δt2>time Δt3), the first element isolation insulation film 11-1 of glass ceramics, in which the crystal lines 19 are closely formed at high density, can be formed. If the time Δt2 is too short, the density of crystal nuclei 25 decreases, and crystal lines 19 cannot be formed at high density. On the other hand, if the time Δt3 is too long, each crystal nuclei 25 grows too large and a crack may occur due to stress.

Thus, the ratio of crystal lines 19 in the second element isolation insulation film 11-2 can be made greater than the ratio of amorphous matrix layer 18 in the second element isolation insulation film 11-2. As a result, advantageously, the expansion coefficient of the whole second element isolation insulation film 11-2 can be made negative, and the negative expansion coefficient can be made higher.

(6) The growth of crystal nuclei 25 can be made uniform, and the tensile stress TS, which is applied by the second element isolation insulation film 11-2, can be made uniform.

By increasing the rate α2 as high as possible, the temperature of the amorphous matrix layer 18 can be made to quickly reach the temperature T3 at which the crystal nucleus 25 grows at the highest rate, the non-uniformity in temperature can be prevented, and the time at which each crystal nucleus 25 is grown can be made uniform. Therefore, advantageously, the crystal nuclei 25 can be uniformly grown, the grain sizes of the crystal lines 19 can be made uniform, and the tensile stress TS, which is applied by the second element isolation insulation film 11-2, can be made uniform.

[Fourth Embodiment (An Example in which Uniaxial Stress is Applied by Element Isolation Insulation Films (Positive and Negative Expansion Coefficients) on a Hybrid Substrate]

Next, referring to FIG. 32 to FIG. 44, a description is given of a semiconductor device and a manufacturing method thereof according to a fourth embodiment of the invention. This embodiment relates to an example in which stress in one axial direction is applied by element isolation insulation films which have plane directions that are advantageous for conductivity types according to the above sections 3 and 3-4, and which have positive and negative expansion coefficients. A detailed description of parts common to those of the above-described first embodiment is omitted here.

<Structure Example>

Figure 33:
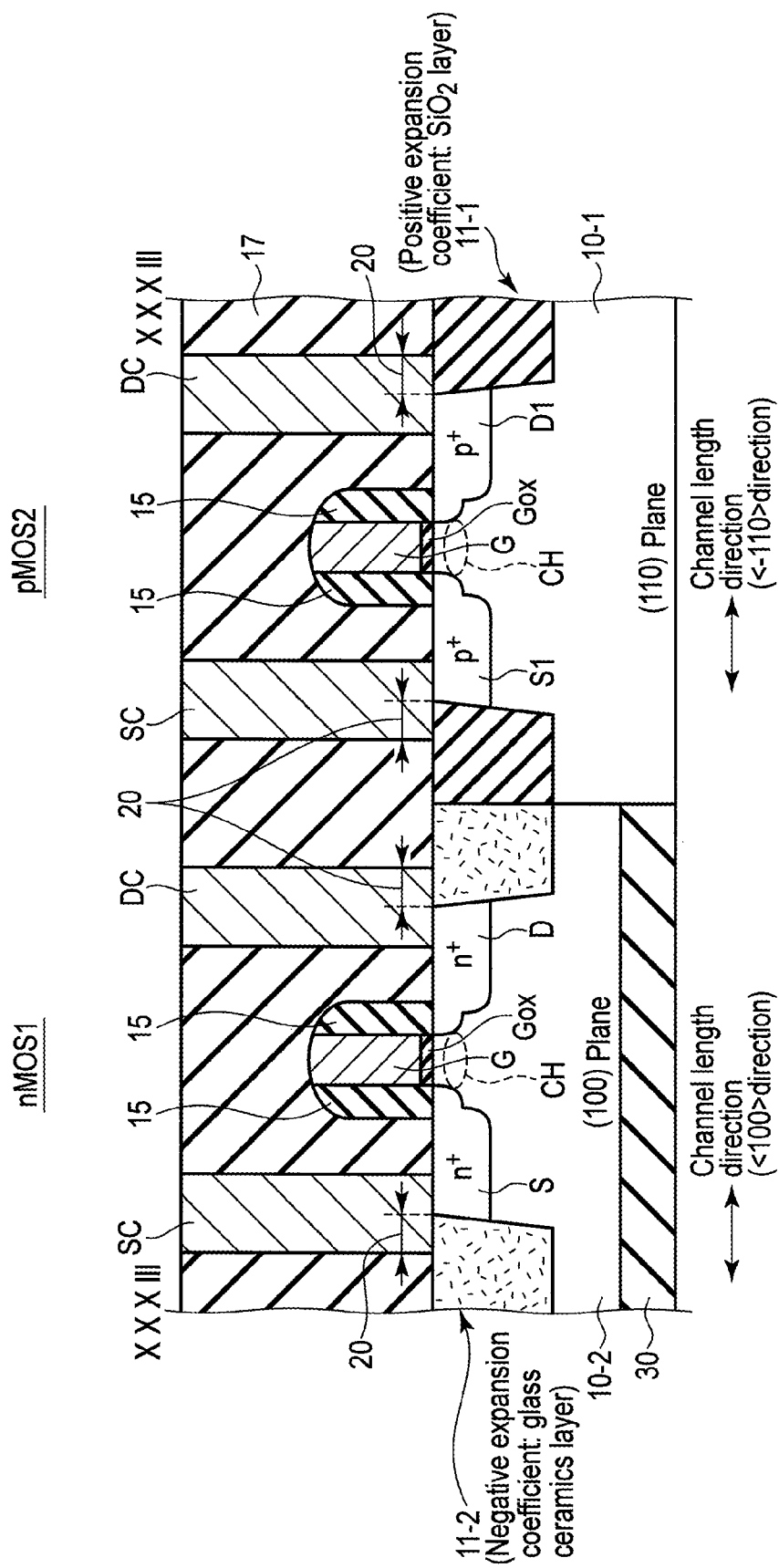
FIG. 33 is a cross-sectional view taken along line XXXIII-XXXIII in FIG. 32.

Referring to FIG. 32 and FIG. 33, a description is given of a structure example of the semiconductor device according to the fourth embodiment. As shown in FIG. 32 and FIG. 33, pMOS transistors in the channel length direction <−110> and nMOS transistors in the channel length direction <100> are alternately and adjacently arranged on hybrid substrates having element formation planes in the (110) plane direction and (100) plane direction.

The pMOS transistors (pMOS1, pMOS2) are disposed along the channel length direction <−110> on a semiconductor substrate 10-1 having the element formation plane in the (110) plane direction. A first element isolation insulation film 11-1 having a positive expansion coefficient is buried and disposed along the channel width direction in the element isolation insulation region. For example, like the above-described examples, the first element isolation insulation film 11-1 is formed of, e.g. a silicon oxide film having a positive expansion coefficient.

The nMOS transistors (nMOS1, nMOS2) are disposed along the channel length direction <100> on a semiconductor substrate (SOI (Silicon On Insulator) substrate) 10-2 including a BOX layer 33 with the element formation plane in the (100) plane direction. A second element isolation insulation film 11-2 having a negative expansion coefficient is buried and disposed along the channel width direction in the element isolation insulation region. For example, like the above-described examples, the second element isolation insulation film 11-2 is formed of, e.g. a glass ceramics layer having a negative expansion coefficient.

<Application of Stress at Time of Driving Operation>

Figure 34:
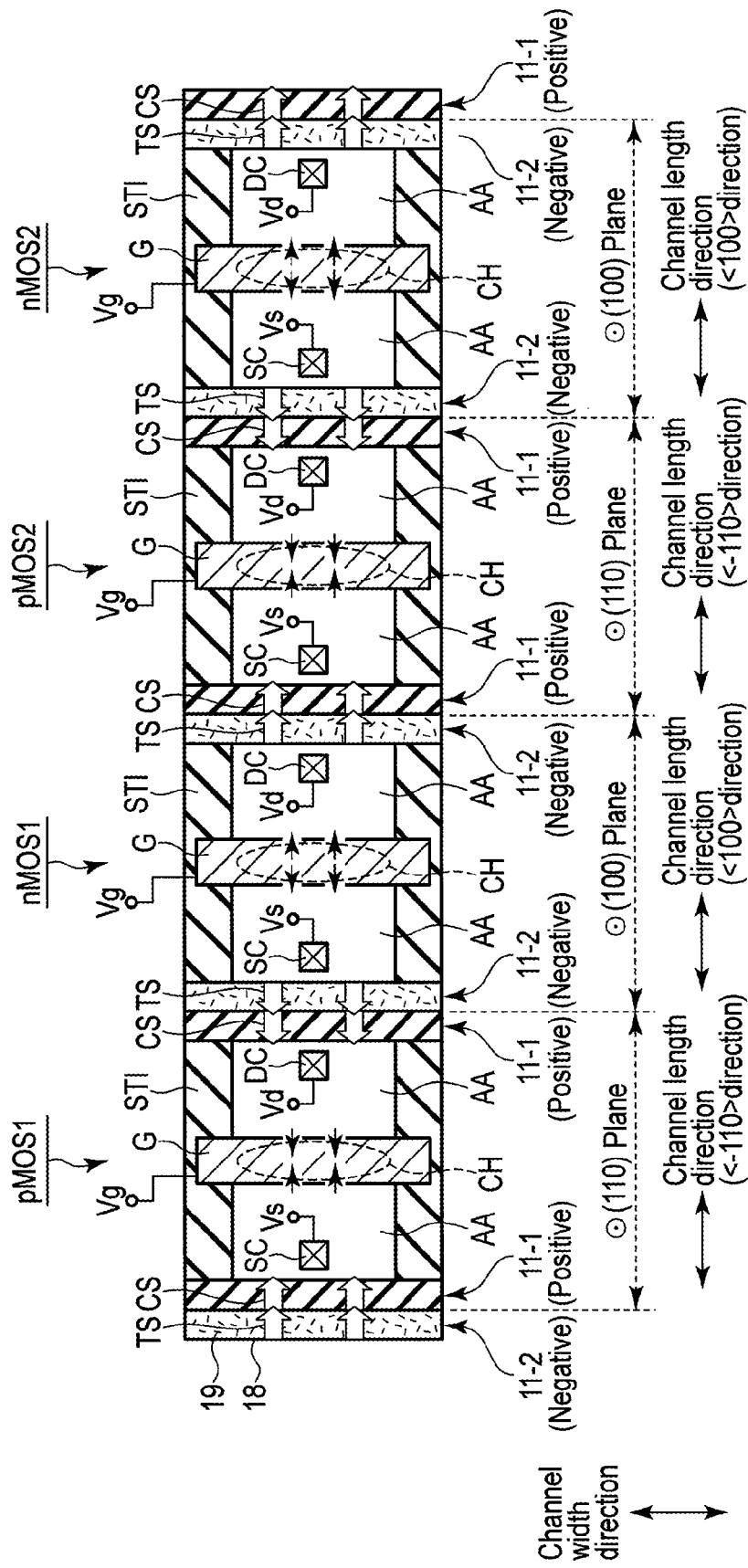
FIG. 34 is a plan view for explaining the driving operation of the semiconductor device according to the fourth embodiment.

Next, referring to FIG. 34 and FIG. 35, a description is given of the application of stress at the time of the driving operation of the semiconductor device according to the fourth embodiment.

As shown in FIG. 34 and FIG. 35, in the above-described structure, when the transistors nMOS1, nMOS2, pMOS1 and pMOS2 are driven, a source voltage Vs, a drain voltage Vd and a predetermined gate voltage Vg are applied. Then, electrons and holes, which are carriers, move in the channel CH which is formed in the semiconductor substrate below the gate electrode G. Thereby, the electrons and holes flow between the source S and drain D, and a switching operation is performed. At this time, operation heat is produced by the application voltage, such as the drain voltage Vd, and the switching current.

If the operation heat is conducted to the first and second element isolation insulation layer 11-1 and 11-2, the first element isolation insulation layer 11-1 expands in accordance with its own positive expansion coefficient, and the second element isolation insulation layer 11-2 contracts in accordance with its own negative expansion coefficient. Accordingly, a compressive stress CS occurs in the first element isolation insulation layer 11-1 along the channel length direction <–110>, and a tensile stress TS occurs in the second element isolation insulation layer 11-2 along the channel length direction <100>. In this case, since the first and second element isolation insulation layer 11-1 and 11-2 are adjacently disposed in the channel length direction, their tensile stress TS and compressive stress CS are mutually strengthened, and the tensile stress TS and compressive stress CS can be increased by the synergistic effect.

As a result, a greater tensile stress is applied in the channel length direction to the channel region CH of the nMOS transistor nMOS1, nMOS2, and a greater compressive stress is applied in the channel length direction to the channel region CH of the pMOS transistor pMOS1, pMOS2.

According to this embodiment, even in the case where the temperature of the semiconductor substrate 10-1, 10-2, etc. rises up to high temperatures, the mobility of electrons, which are carriers of the nMOS transistor, and the mobility of holes, which are carriers of the pMOS transistor, can advantageously be improved at the same time.

<Manufacturing Method>

Next, referring to FIGS. 36A and 36B through FIG. 44, a description is given of a method of manufacturing the semiconductor device according to the fourth embodiment.

Manufacturing Method of Hybrid Substrates

To begin with, referring to FIGS. 36A and 36B through FIGS. 38A and 38B, a description is given of a method of fabricating hybrid substrates which are used in the method of manufacturing the semiconductor device according to the fourth embodiment. In the description below, FIG. 36A through FIG. 38A illustrate a process of fabricating a semiconductor substrate having an element formation plane in the (110) plane direction, and FIG. 36B through FIG. 38B illustrate a process of fabricating a semiconductor substrate having an element formation plane in the (100) plane direction.

As shown in FIG. 36A and FIG. 36B, silicon oxide films (Oxide) are formed by, e.g. a thermal oxidation method, as BOX layers 30 on the surfaces of semiconductor substrates 10-1 and 10-2 having the element formation planes in the (110) plane direction and (100) plane direction, respectively.

Subsequently, hydrogen ions H are doped by, e.g. an ion implantation method, from the surfaces of the semiconductor substrates 10-1 and 10-2 to predetermined depths D1 and D2 or thereabout. The hydrogen ions H function as an etching stopper in a later fabrication step of reducing the thickness of the semiconductor substrates 10-1 and 10-2. Thus, the depth D1, D2, corresponds to the thickness of the semiconductor substrate 10-1, 10-2.

As shown in FIG. 37A and FIG. 37B, the semiconductor substrates 10-1 and 10-2 are inverted, and the BOX layers 30 are bonded to operation substrates 33 such that their element formation planes are set in the (110) plane direction and (100) plane direction, respectively.

Subsequently, as shown in FIG. 37A and FIG. 37B, using the doped hydrogen ions H as a stopper, the thicknesses of the semiconductor substrate 10-1 and 10-2 are reduced to thicknesses D1 and D2 or thereabout by using, e.g. a CMP method.

By the above fabrication process, semiconductor substrates (SOI substrates) having element formation planes in the (110) plane direction and (100) plane direction can be manufactured.

Manufacturing Method of Elements Using Hybrid Substrates

Next, referring to FIG. 39 to FIG. 44, a description is given of a method of manufacturing the semiconductor device according to the present embodiment by using the hybrid substrates which have been manufactured as described above. The description given below exemplifies the use of the semiconductor substrate (SOI substrate) with the element formation plane in the (100) plane direction.

Figure 39:
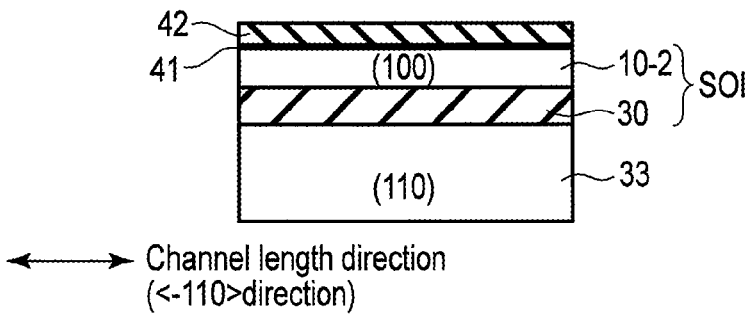
FIG. 39 is a cross-sectional view illustrating a fabrication step of the semiconductor device according to the fourth embodiment.

To start with, as shown in FIG. 39, an $SiO_2$ film 41 is formed by, e.g. a thermal oxidation method, on the semiconductor substrate 10-2 having the element formation plane in the (100) plane direction. Then, a nitride film 42 is formed by, e.g. CVD, on the $SiO_2$ film 41.

Figure 40:
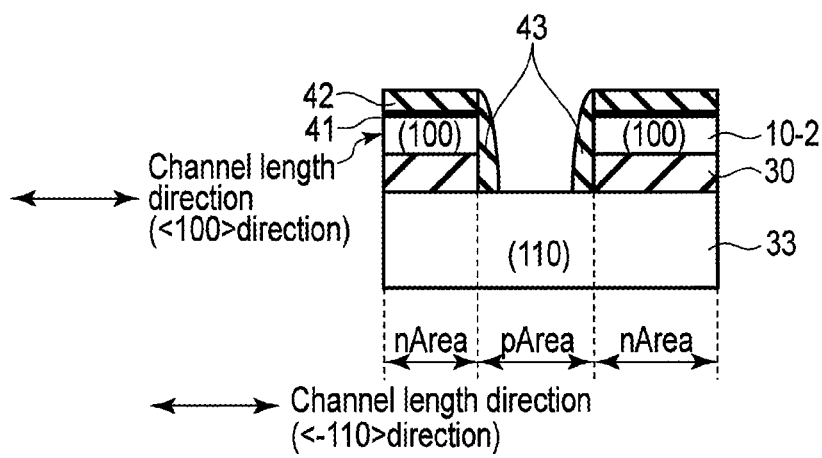
FIG. 40 is a cross-sectional view illustrating a fabrication step of the semiconductor device according to the fourth embodiment.

Subsequently, as shown in FIG. 40, a predetermined trench is formed by, e.g. RIE, in that part of the semiconductor substrate 10-1 and BOX layer 30, which corresponds to a pMOS transistor formation area (pArea). Then, SiN films are formed by, e.g. CVD, as spacers 43 on side walls of the trench.

Figure 41:
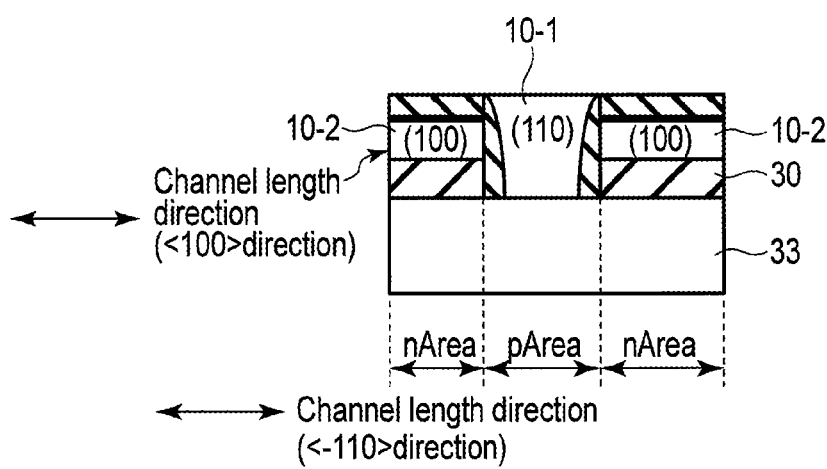
FIG. 41 is a cross-sectional view illustrating a fabrication step of the semiconductor device according to the fourth embodiment.

Thereafter, as shown in FIG. 41, the silicon substrate 10-1 with the element formation surface in the (110) plane direction is formed by using, e.g. an epitaxial method, so as to fill the trench.

Figure 42:
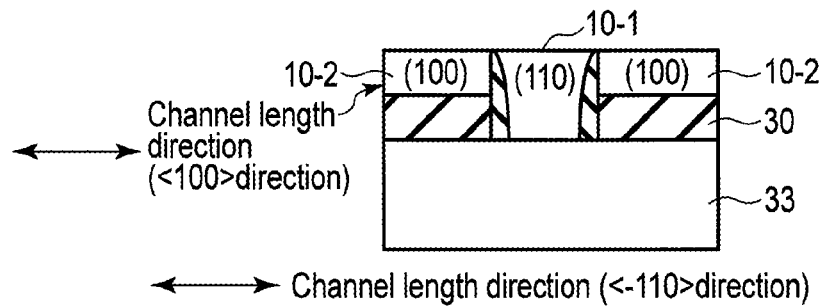
FIG. 42 is a cross-sectional view illustrating a fabrication step of the semiconductor device according to the fourth embodiment.

Following the above, as shown in FIG. 42, the nitride film 42 and $SiO_2$ film are removed by, e.g. CMP.

Figure 43:
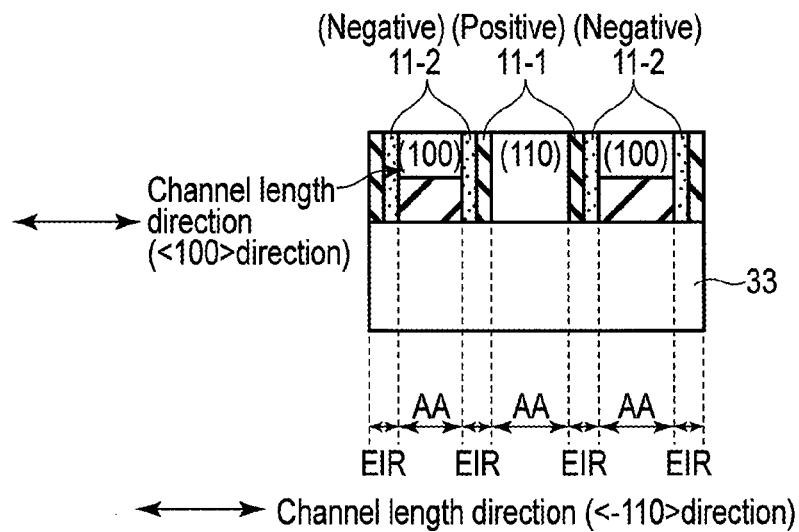
FIG. 43 is a cross-sectional view illustrating a fabrication step of the semiconductor device according to the fourth embodiment.

As shown in FIG. 43, trenches for element isolation are formed by, e.g. RIE, in the semiconductor substrates 10-1 and 10-2 and BOX 30 in element isolation regions EIR, the trenches reaching the surface of the operation substrate 33.

Using the same fabrication method as described above, first and second device isolation insulation films 11-1 and 11-2, which have a positive or negative expansion coefficient, are buried in the trenches for element isolation. In this case, while one of the first and second element insulation isolation films 11-1 and 11-2 is being formed, the region of the other is covered with a protection film or the like. For example, while the second element isolation insulation film 11-2 of the nMOS transistor nMOS1, nMOS2 is being formed, a silicon nitride ($Si_3N_4$) film, for instance, is deposited by, e.g. CVD, on the formation region of the pMOS transistor pMOS1, pMOS2, thereby forming a protection film. After the second element isolation insulation film 11-2 is formed, the protection film is removed.

Figure 44:
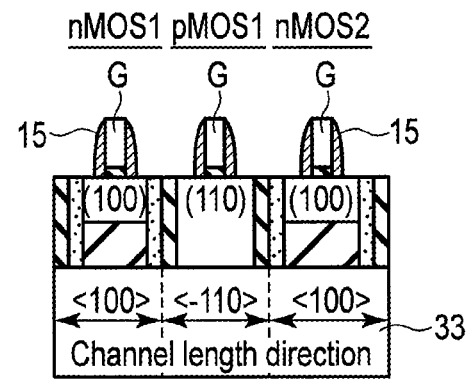
FIG. 44 is a cross-sectional view illustrating a fabrication step of the semiconductor device according to the fourth embodiment.

Following the above, as shown in FIG. 44, using substantially the same manufacturing process as described above, the pMOS transistor (pMOS1, pMOS2) is formed on the semiconductor substrate having the element formation plane in the (110) plane direction, and the nMOS transistor (nMOS1, nMOS2) is formed on the semiconductor substrate having the element formation plane in the (100) plane direction. Thus, the semiconductor device according to the present embodiment is formed. At this time, gate electrodes G, etc. are formed so that the channel length direction of the transistor pMOS1, pMOS2 is set in the <–110> direction and the channel length direction of the transistor nMOS1, nMOS2 is set in the <100> direction.

<Advantageous Effects>

With the semiconductor device and the manufacturing method thereof according to the fourth embodiment of the invention, at least the same advantageous effects (1) to (6) as described above can be obtained. In addition, in the present embodiment, at least the following advantageous effects (7) and (8) can be obtained.

(7) The mobility can further be improved in association with the conductivity types.

In the present embodiment, the pMOS transistors in the channel length direction <−110> and the nMOS transistors in the channel length direction <100> are alternately and adjacently arranged on the hybrid substrates having the element formation planes in the (110) plane direction and (100) plane direction. Thus, as has been described in the above section 4-2, the (100) plane direction and (110) plane direction, which are advantageous for the improvement of mobility, are set in association with the n-type and p-type transistors. Therefore, this embodiment is more advantageous in improving the mobility.

Furthermore, in the present embodiment, although different plane directions, i.e. the (100) plane direction and (110) plane direction, are adopted, the p-type and n-type transistors are disposed on the silicon substrates 10-1 and 10-2. On the other hand, no use is made of a so-called strained semiconductor substrate of, e.g. SiGe or strained Si. Thus, in the structure of this embodiment, the reliability can advantageously be enhanced in that defects are few and a leak current can be reduced.

(8) The manufacturing cost can advantageously be reduced.

In the case where a so-called strained semiconductor substrate of, e.g. SiGe or strained Si is used, the number of fabrication processes and the number of manufacturing devices increase, and the manufacturing cost tends to increase.

In the present embodiment, there is no need to use such a strained semiconductor substrate. Although different plane directions, i.e. the (100) plane direction and (110) plane direction, are adopted, the silicon substrates 10-1 and 10-2 can be applied. Therefore, the number of fabrication processes and the number of manufacturing devices can be decreased, and the manufacturing cost can advantageously be reduced.

[Fifth Embodiment (An Example in which Biaxial Stress is Applied to Plural N-Type and P-Type Transistors)]

Figure 46:
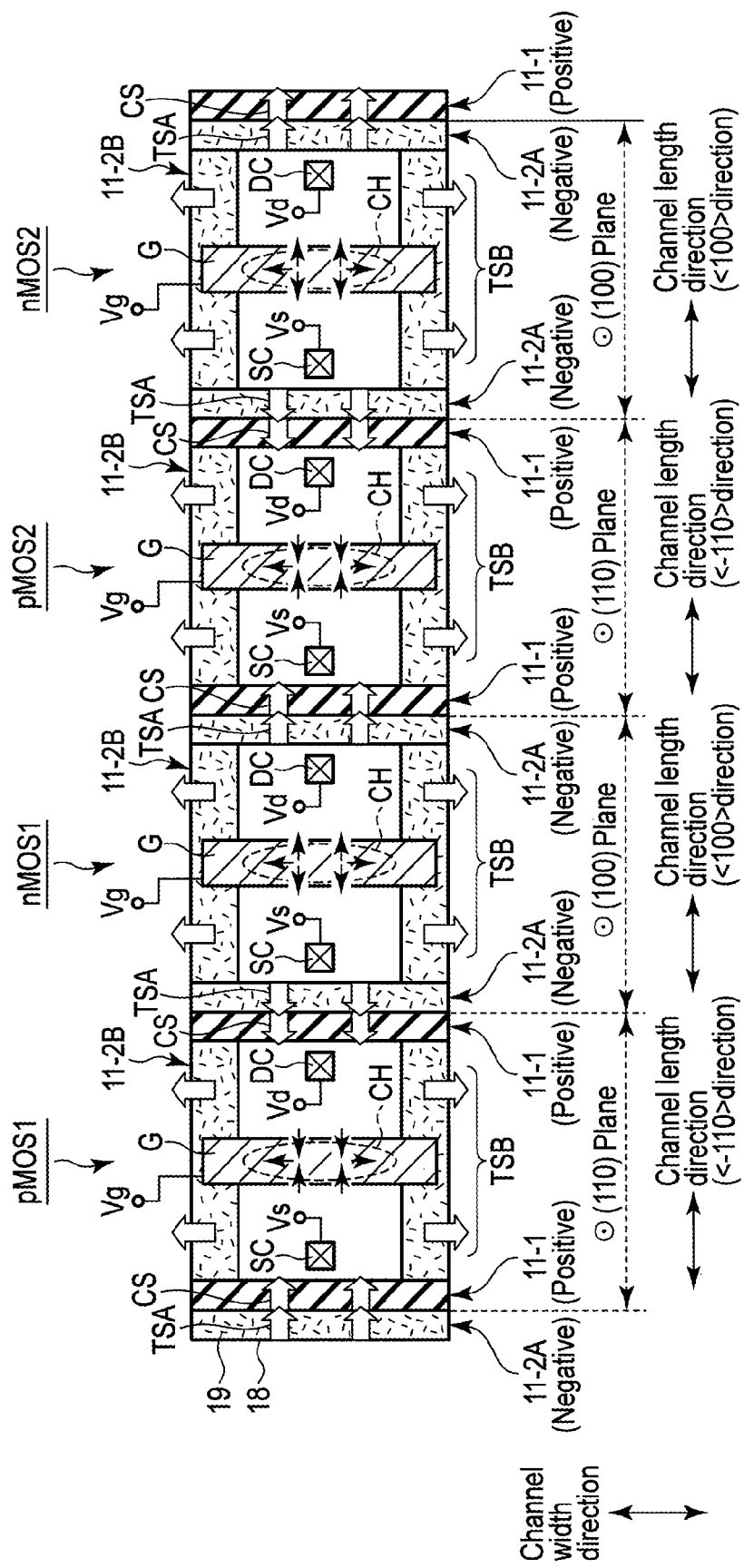
FIG. 46 is a plan view for explaining the driving operation of the semiconductor device according to the fifth embodiment.

Next, referring to FIG. 45 and FIG. 46, a description is given of a semiconductor device according to a fifth embodiment of the invention. The fifth embodiment relates to an example in which stress in two axial directions is applied to a plurality of n-type and p-type transistors. A detailed description of parts common to those of the above-described fourth embodiment is omitted here.

<Structure Example>

Referring to FIG. 45, a description is given of a structure example of the semiconductor device according to the present embodiment. As shown in FIG. 45, the semiconductor device of the fifth embodiment differs from that of the fourth embodiment in that a second element isolation insulation film 11-2B having a negative expansion coefficient is also disposed along the channel length direction in the semiconductor substrate 10-1, 10-2 in the element isolation insulation region in a manner to surround the transistor nMOS1, nMOS2, pMOS1, pMOS2. In other words, the present embodiment differs from the fourth embodiment in that the first and second element isolation insulation films 11-1, 11-2A and 11-2B are disposed in the channel width direction and the channel length direction in the semiconductor substrate 10-1, 10-2 in the element isolation insulation region, such that the transistor nMOS1, nMOS2, pMOS1, pMOS2, is surrounded.

The second element isolation insulation film 11-2B has the same structure as the second element isolation insulation film 11-2A. Specifically, the second element isolation insulation film 11-2B is formed of a glass ceramics layer including an amorphous matrix layer 18 and crystal lines 19 dispersed in the amorphous matrix layer 18. The first element isolation insulation film 11-1 has a negative expansion coefficient, as in the above-described case.

<Application of Stress at Time of Driving Operation>

Next, referring to FIG. 46, a description is given of the application of stress at the time of the driving operation of the semiconductor device according to the fifth embodiment.

As shown in FIG. 46, in the above-described structure, when the transistors nMOS1, nMOS2, pMOS1 and pMOS2 are driven, a source voltage Vs, a drain voltage Vd and a positive gate voltage Vg are applied. Then, electrons and holes, which are carriers, move in the channel CH which is formed in the semiconductor substrate 10-1, 10-2 below the gate electrode G. Thereby, the electrons and holes flow between the source S and drain D, and a switching operation is performed. At this time, operation heat is produced by the application voltage, such as the drain voltage Vd, and the switching current.

If the operation heat is conducted to the first and second element isolation insulation layer 11-1, 11-2A and 11-2B, the first element isolation insulation layer 11-1 expands in accordance with its own positive expansion coefficient, and the second element isolation insulation layers 11-2A and 11-2B contract in accordance with their own negative expansion coefficients. Accordingly, a compressive stress CS occurs in the first element isolation insulation layer 11-1 along the channel length direction <−110> or <100>. Tensile stresses TSA and TSB occur in the second element isolation insulation layers 11-2A and 11-2B along the channel length direction <−110> or <100> and the channel width direction.

In this case, since the first and second element isolation insulation layer 11-1 and 11-2A are adjacently disposed, their tensile stress TSA and compressive stress CS are mutually strengthened, and the tensile stress TSA and compressive stress CS can be increased by the synergistic effect.

As a result, a greater tensile stress along the channel length direction <100> and a greater tensile stress along the channel width direction are applied at the same time in two axial directions to the channel region CH of the nMOS transistor nMOS1, nMOS2.

Similarly, a greater compressive stress along the channel length direction <−110> and a greater tensile stress along the channel width direction are applied at the same time in two axial directions to the channel region CH of the pMOS transistor pMOS1, pMOS2.

To apply the tensile stress to the channel region CH in two mutually perpendicular directions at the same time is advantageous since the conductivity type of the transistor is not limited.

<Advantageous Effects>

With the semiconductor device and the manufacturing method thereof according to the fifth embodiment, at least the same advantageous effects (1) to (8) as described above can be obtained.

In addition, according to this embodiment, even in the case where the temperature of the semiconductor substrate 10-1, 10-2, etc. rises up to high temperatures, the mobility of electrons, which are carriers of the nMOS transistor, and the mobility of holes, which are carriers of the pMOS transistor, can advantageously be improved at the same time.

The above description is directed to the example of the semiconductor device in which the channel length direction is the <−110> direction. However, the invention is not limited to this example. As described in the section 4-3, even in the case where the channel length direction is the <001> direction that is perpendicular to the <−110> direction, the invention is similarly applicable and the same advantageous effects can be obtained.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   an insulated-gate field-effect transistor which is disposed on a semiconductor substrate having an element formation plane in a (110) plane direction, and which has a channel length direction in a <−110> direction;
   a first element isolation insulation film which is filled in a trench in an element isolation region of the semiconductor substrate and consists of a $SiO_2$-based material, wherein the $SiO_2$-based material has a positive expansion coefficient under the application of heat, and the insulated-gate field-effect transistor is in a state of compression in the channel length direction as a result of expansion of the first element isolation insulation film due to operation heat of the semiconductor device; and
   a second element isolation insulation film which is filled in a trench in an element isolation region of the semiconductor substrate and has a negative expansion coefficient, the second element isolation insulation film applying, together with the first element isolation insulation film, a tensile stress by operation heat to the insulated-gate field-effect transistor in two axial directions that are the channel length direction and a channel width direction.

2. The device of claim 1, wherein carriers of the insulated-gate field-effect transistor are electrons or holes.

3. The device of claim 1, wherein the second element isolation insulation film includes a glass ceramics layer including an amorphous matrix layer and crystal lines dispersed in the amorphous matrix layer, or includes a $HfW_2O_8$ layer.

4. The device of claim 1, further comprising a contact wiring line provided on a source or a drain, a portion of the contact wiring line being provided on a fringe of each of the first and second element isolation insulation films.

5. The device of claim 1, wherein the first element isolation insulation film extends along a channel width direction and is disposed in a manner to sandwich the insulated-gate field-effect transistor.

6. The device of claim 1, wherein the second element isolation insulation film extends along the channel length direction and is disposed in a manner to sandwich the insulated-gate field-effect transistor.

7. A semiconductor device comprising:
   a p-type insulated-gate field-effect transistor which is disposed on a semiconductor substrate having an element formation plane in a (110) plane direction, and which has a channel length direction in a <−110> direction;
   a first element isolation insulation film which is filled in a trench in an element isolation region of the semiconductor substrate and consists of a $SiO_2$-based material, the $SiO_2$-based material having a positive expansion coefficient, the first element isolation insulation film applying a compressive stress by operation heat to the p-type insulated-gate field-effect transistor in the channel length direction;
   an n-type insulated-gate field-effect transistor which is disposed on a semiconductor substrate having an element formation plane in a (100) plane direction, and which has a channel length direction in a <100> direction; and
   a second element isolation insulation film which is filled in a trench in an element isolation region of the semiconductor substrate and has a negative expansion coefficient, the second element isolation insulation film applying a tensile stress by operation heat to the n-type insulated-gate field-effect transistor in the channel length direction.

8. The device of claim 7, wherein the second element isolation insulation film includes a glass ceramics layer including an amorphous matrix layer and crystal lines dispersed in the amorphous matrix layer, or includes a $HfW_2O_8$ layer.

9. The device of claim 7, further comprising a contact wiring line provided on a source or a drain, a portion of the contact wiring line being provided on a fringe of each of the first and second element isolation insulation films.

10. The device of claim 7, wherein the first element isolation insulation film extends along a channel width direction and is disposed in a manner to sandwich the p-type insulated-gate field-effect transistor.

11. The device of claim 7, wherein the second element isolation insulation film extends along the channel width direction and is disposed in a manner to sandwich the n-type insulated-gate field-effect transistor.

12. The device of claim 7, wherein the p-type and n-type element isolation insulation films are adjacently disposed along the channel length direction.

13. The device of claim 7, further comprising a third element isolation insulation film which is filled in a trench in an element isolation region of the semiconductor substrate and extends along the channel length direction in a manner to sandwich the p-type and n-type insulated-gate field-effect transistors, the third element isolation insulation film having a negative expansion coefficient and applying, together with the first and second element isolation insulation films, a stress by operation heat to the p-type and n-type insulated-gate field-effect transistors in two axial directions that are the channel length direction and a channel width direction.

14. The device of claim 7, wherein the semiconductor substrate is a bulk semiconductor substrate.

* * * * *